United States Patent
Mo

(10) Patent No.: US 7,684,238 B2
(45) Date of Patent: Mar. 23, 2010

(54) METHODS OF PROGRAMMING MULTI-BIT FLASH MEMORY DEVICES AND RELATED DEVICES

(75) Inventor: Hyun-Sun Mo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 11/843,219

(22) Filed: Aug. 22, 2007

(65) Prior Publication Data

US 2008/0049497 A1    Feb. 28, 2008

(30) Foreign Application Priority Data

Aug. 24, 2006  (KR) .................. 10-2006-0080698
Aug. 16, 2007  (EP) .................. 07016055

(51) Int. Cl.
*G11C 11/34* (2006.01)
(52) U.S. Cl. .................. 365/185.03; 365/185.22; 365/185.17; 365/185.24; 365/189.05
(58) Field of Classification Search ............ 365/185.17, 365/185.33, 185.03, 185.08
See application file for complete search history.

(56) References Cited

U.S. PATENT DOCUMENTS

| | | | |
|---|---|---|---|
| 5,473,563 A | 12/1995 | Suh et al. |
| 5,768,188 A | 6/1998 | Park et al. |
| 5,862,074 A | 1/1999 | Park |
| 5,867,429 A | 2/1999 | Chen et al. |
| 5,923,587 A | 7/1999 | Choi |
| 5,930,172 A | 7/1999 | Kucera |
| 5,966,326 A | 10/1999 | Park et al. |
| 5,982,663 A | 11/1999 | Park |
| 6,075,734 A | 6/2000 | Jang |
| 6,122,188 A | 9/2000 | Kim et al. |
| 6,266,273 B1 | 7/2001 | Conley et al. |
| 6,278,636 B1 | 8/2001 | Lee |
| 6,288,935 B1 | 9/2001 | Shibata et al. |
| 6,496,412 B1 | 12/2002 | Shibata et al. |
| 6,522,580 B2 | 2/2003 | Chen et al. |
| 6,813,184 B2 | 11/2004 | Lee |

(Continued)

FOREIGN PATENT DOCUMENTS

EP    1280161 A1    1/2003

(Continued)

OTHER PUBLICATIONS

European Search Report, Reference: P 47895 EP; Application No./Patent No. 07016055.1-1233 / 1892721.

(Continued)

*Primary Examiner*—Tuan T Nguyen
*Assistant Examiner*—Tha-O Bui
(74) *Attorney, Agent, or Firm*—Myers Bigel Sibley & Sajovec

(57) ABSTRACT

Methods of programming a multi-bit non-volatile memory device are provided. The multi-bit non-volatile memory device includes a memory cell array including a plurality of memory cells and a storage unit electrically coupled to the memory cell array. A first bit (FB) of multi-bit data is programmed from the storage unit into one of the plurality of memory cells in the memory cell array. A second bit (SB) of multi-bit data is programmed from the storage unit into one of the plurality of memory cells in the memory cell array using data inversion. Related memory devices are also provided.

29 Claims, 20 Drawing Sheets

U.S. PATENT DOCUMENTS

| | | |
|---|---|---|
| 6,965,964 B2 | 11/2005 | Lee et al. |
| 7,023,737 B1 | 4/2006 | Wan et al. |
| 7,035,144 B2 | 4/2006 | Kim et al. |
| 7,206,233 B2 | 4/2007 | Shiota et al. |
| 7,257,026 B2 | 8/2007 | Yamada et al. |
| 7,457,157 B2 * | 11/2008 | Kim ............ 365/185.03 |
| 2003/0016559 A1 | 1/2003 | Kawai et al. |
| 2004/0221092 A1 | 11/2004 | Lee |
| 2005/0276107 A1 | 12/2005 | Shiga et al. |
| 2006/0164885 A1 | 7/2006 | Yang et al. |
| 2006/0181924 A1 | 8/2006 | Cha |
| 2007/0124558 A1 | 5/2007 | Lee et al. |

FOREIGN PATENT DOCUMENTS

| | | |
|---|---|---|
| EP | 1326257 A2 | 7/2003 |
| EP | 1326257 A3 | 8/2006 |
| JP | 11-144479 A | 5/1999 |
| JP | 2001-093288 | 4/2001 |
| JP | 2003-233529 A | 8/2003 |
| JP | 1020030047171 | 1/2005 |
| JP | 2005-032431 | 2/2005 |
| KR | 1019990057216 A | 7/1999 |
| KR | 1020010068554 A | 7/2001 |
| KR | 1020010070086 A | 7/2001 |
| KR | 1020020057055 A | 7/2002 |
| KR | 1020030002730 A | 1/2003 |
| KR | 1020040098642 A | 11/2004 |
| KR | 1020050007653 A | 1/2005 |
| KR | 1020050059249 A | 6/2005 |
| KR | 1020050068554 A | 7/2005 |
| KR | 1020050069218 | 7/2005 |
| KR | 1020050087264 A | 8/2005 |
| KR | 1020060024149 A | 3/2006 |
| KR | 1020060056236 A | 5/2006 |
| WO | WO97/50090 | 12/1997 |
| WO | WO98/01861 A1 | 1/1998 |

OTHER PUBLICATIONS

European Search Report, Application No. 07016257.3, Sep. 23, 2008, 7 pages.

Notice to File a Response in Korean Application 10-2006-0044833; Nov. 4, 2006.

* cited by examiner

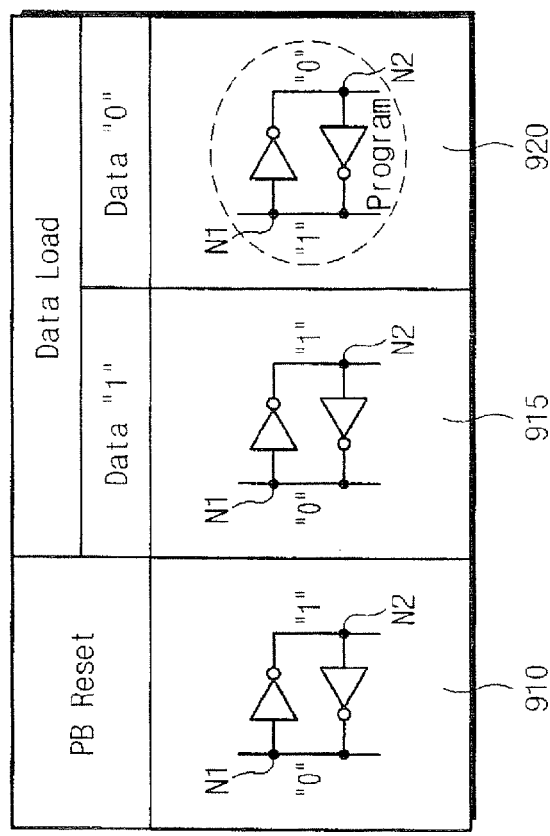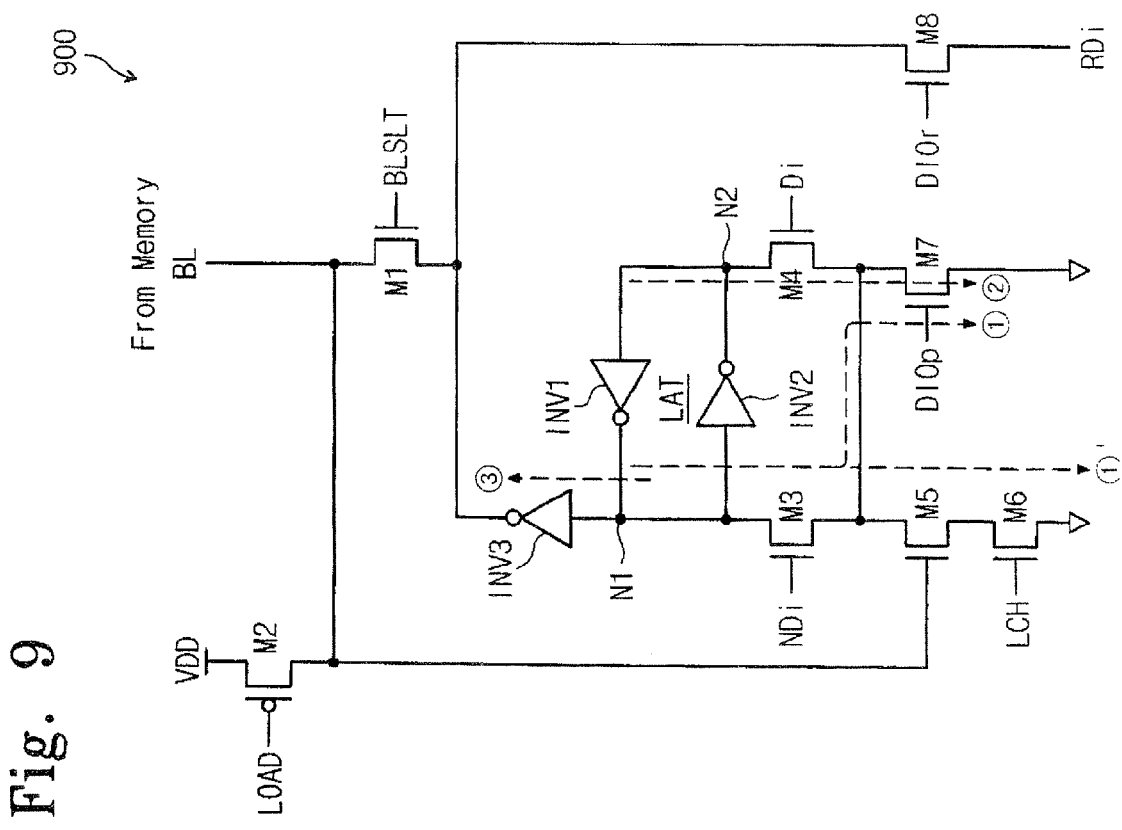
Fig. 9

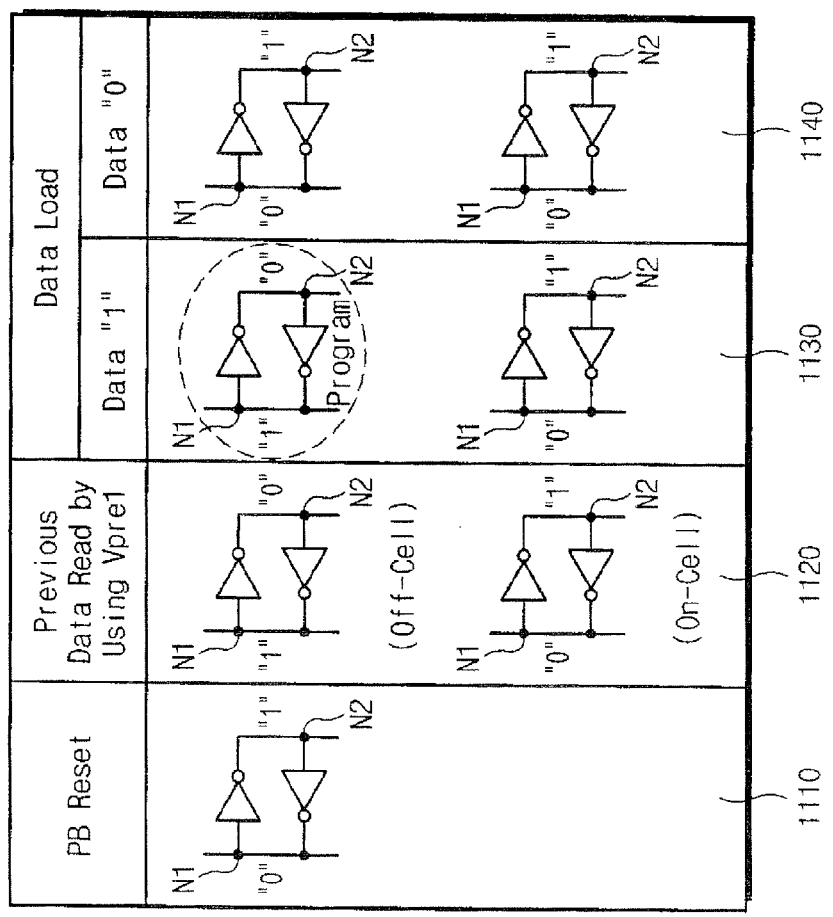
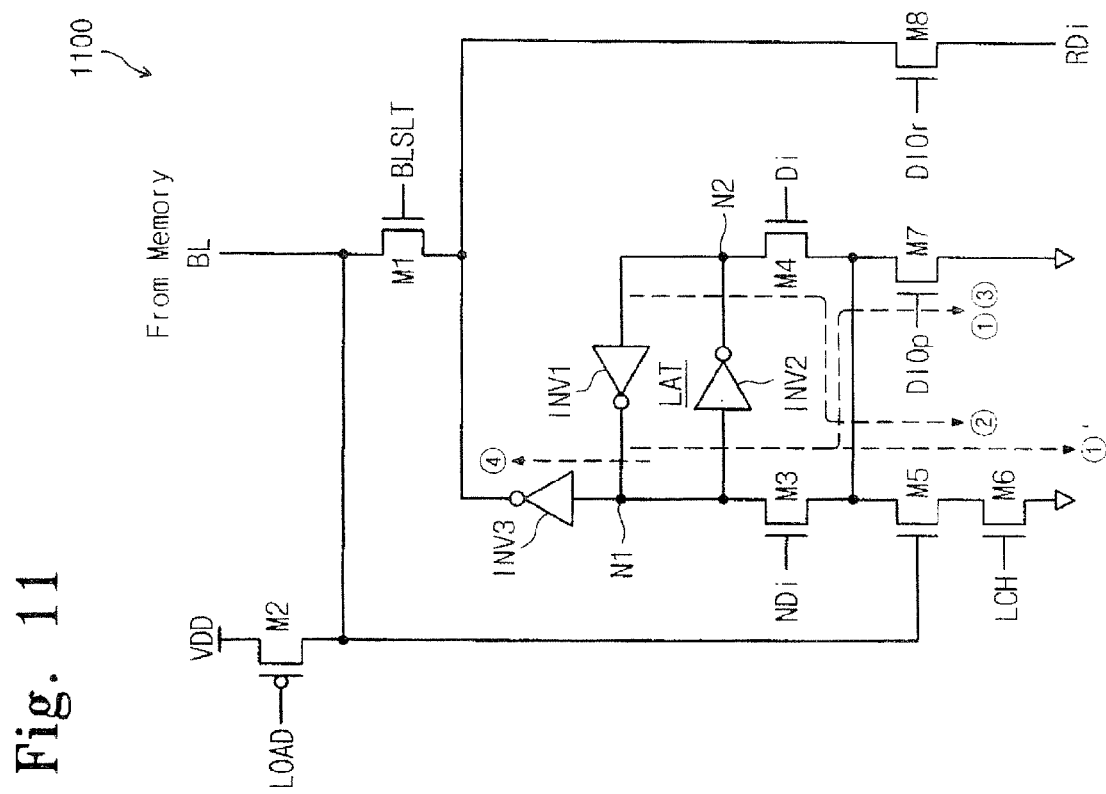
Fig. 11

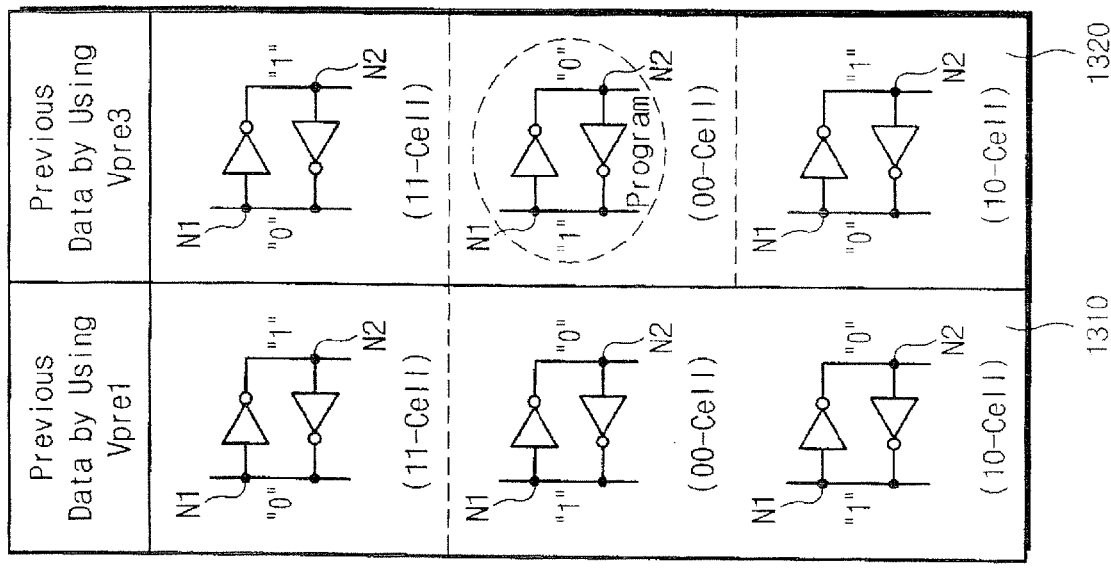
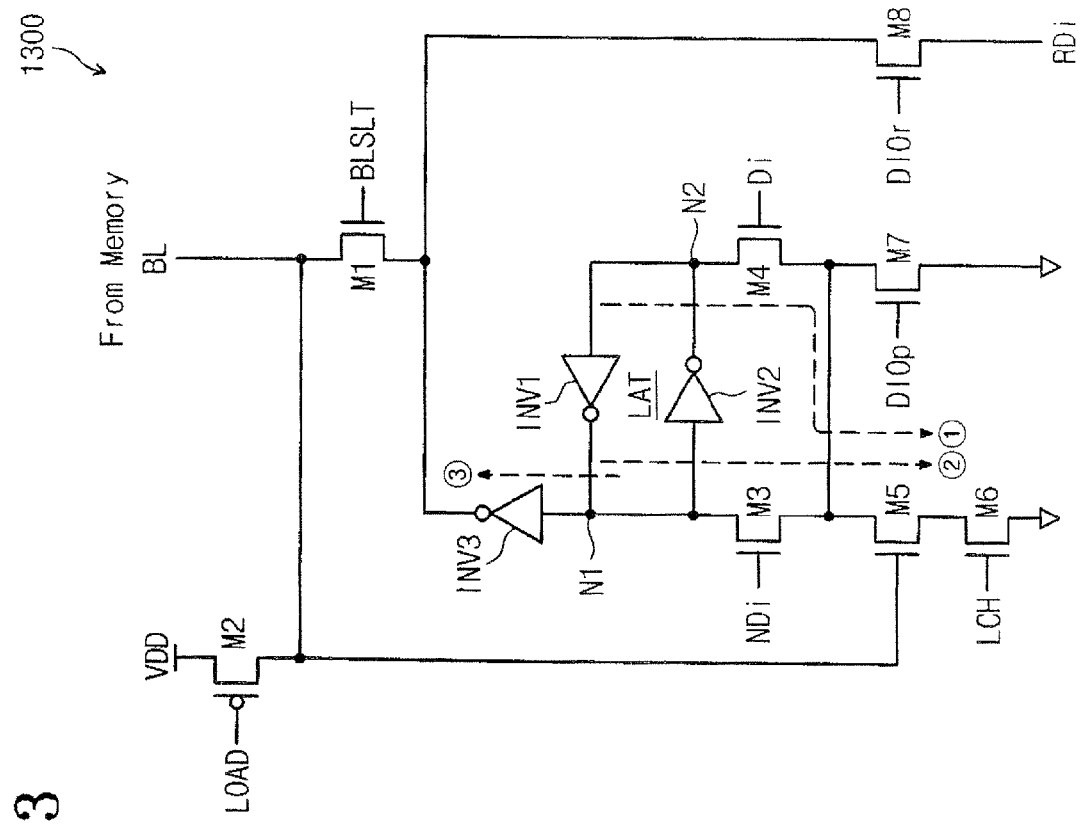
Fig. 13

METHODS OF PROGRAMMING MULTI-BIT FLASH MEMORY DEVICES AND RELATED DEVICES

CROSS-REFERENCE TO RELATED APPLICATION

This application claims the benefit of Korean Patent Application No. 2006-0080698, filed Aug. 24, 2006 and European Patent Application No. 07016055.1, filed on Aug. 16, 2007, the disclosures of which are hereby incorporated herein by reference in their entirety.

FIELD OF THE INVENTION

The present invention relates generally to flash memory devices and, in particular, to multi-bit flash memory devices and methods of programming the same.

BACKGROUND OF THE INVENTION

A NAND flash memory including an electrically erasable programmable read only memory (EEPROM) has been proposed as an electrically rewritable non-volatile semiconductor memory. In the NAND flash memory, the sources and drains of memory cells arranged side by side are connected in series and the series connection of the memory cells is connected as one unit to a bit line. Furthermore, all or half of the cells arranged in the direction of a row are written into or read from simultaneously. Recently, a multi-valued memory that enables data items to be stored in one cell in a NAND flash memory has been developed.

Conventional multi-valued memory may include, for example, three memory cells or states "0", "1", "2" and "3". When the memory cells are erased, the data in the memory cell is brought to state "0". A write operation causes the threshold voltage of the memory cell to move to a higher level. When 2-bit data is stored in a single memory cell, the 2-bit data is separated into first and second page data. The first-page data and second-page data are switched using an address.

When data is written into a memory cell, the first-page data is written and then the second-page data is written. When the write data constituting the first-page or second-page data is "1", the threshold voltage of the memory cell does not change in the write operation, with the result that the data in the memory cell remains unchanged. Namely, the data is not written. When write data constituting the first-page or second-page data is "0", the threshold voltage of the memory cell is changed in the write operation. As a result, the data in the memory cell is changed, causing the data to be written.

It is typically assumed that the data in the memory cell in the erased state is in state "0", i.e., the first page is "1" and the second page is "1", resulting in "11". First, the first-page data is written into the memory cell. When the write data is "1", the data in the memory cell remains in state "0". When the write data is "0", the data in the memory cell goes to state "1".

Next, the second-page data is written. At this time, when write data "0" is externally supplied to the memory cell whose data has become state "1" as a result of the first-page write operation, the data in the memory cell is brought into state "3" or "00". Moreover, when data "0" is externally supplied to the memory cell whose data has remained in state "0" as a result of the first-page write operation, the data in the memory cell is brought into state "2" or "01".

Furthermore, when data "1" is externally supplied to the memory cell whose data has become state "1" as a result of the first-page write operation, the data in the memory cell is allowed to remain in state "1" or "10". In addition, when data "1" is externally supplied to the memory cell whose data has remained in state "0" as a result of the first-page write operation, the data in the memory cell is allowed to remain in state "0" or "11".

During a read operation, the second-page data is read first and then the first-page data. Thus, when the second-page data is read, if the data in the memory cell is in state "0" or state "1", the read-out data will be "1". Furthermore, if the data in the memory cell is in state "2" or state "3", the read-out data will be "0". For this reason, when the second-page data is read, a determination can be made through only one operation of judging whether the data in the memory cell is in either state "1" or below or state "2" or above.

In contrast, when the first page data is read, if the data in the memory cell is in state "0" or state "2", the data to be read will be "1". If the data in the memory cell is in state "1" or state "3", the data to be read will be "0". Consequently, the first page requires a total of three read operations for the following determinations: a determination whether the data in the memory cell is in either state "0" or state "1" or above, a determination whether the data in the memory cell is in either state "1" or below or state "2", or above, and a determination whether the data in the memory cell is in either state "2" or below or state "3".

Thus, conventional memory devices require at least three read operations to determine the state of the data in a memory cell. Methods of programming/reading multi-bit data that attempt to address the number of reads in a conventional operation are discussed in U.S. Pat. Nos. 6,288,935 and 6,522,580. However, there continues to be a need for improved methods of programming multi-bit data into memory cells.

SUMMARY OF THE INVENTION

Some embodiments of the present invention provide methods of programming a multi-bit non-volatile memory device. The multi-bit non-volatile memory device includes a memory cell array including a plurality of memory cells and a storage unit electrically coupled to the memory cell array. A first bit (FB) of multi-bit data is programmed from the storage unit into one of the plurality of memory cells in the memory cell array. A second bit (SB) of multi-bit data is programmed from the storage unit into one of the plurality of memory cells in the memory cell array using data inversion.

In further embodiments of the present invention, programming a second bit of multi-bit data may include executing a first SB program using data inversion, executing a second SB program and executing a third SB program to provide the programmed second bit of multi-bit data.

In still further embodiments of the present invention the first SB program operation using data inversion may include bringing data in one of the memory cells whose data is in FB state "10" before the first SB program operation into SB state "10" after the first SB program operation.

In some embodiments of the present invention, data in the storage unit may be inverted and executing the first SB program may include executing the first SB program using the inverted data. In certain embodiments of the present invention, after data inversion, data "0" is inhibited and data "1" is programmed.

In further embodiments of the present invention, the second SB program operation may include bringing one of the memory cells whose data is in FB state "10" before the second SB program into state "00" after the second SB program.

In still further embodiments of the present invention, the third SB program operation may include bringing one of the memory cells whose data is in state "11" before the third SB program operation into state "01" after the third SB program operation to provide a programmed second bit of multi-bit data.

In some embodiments of the present invention, programming using data inversion may allow the second bit of multi-bit data to be programmed into the memory cell with two read operations.

In further embodiments of the present invention, reading the second bit of multi-bit data using two read operations further includes applying a first read voltage to one of the memory cells and applying a second read voltage to the one of the memory cells to read the second bit of multi-bit data in the one of the memory cells.

In still further embodiments of the present invention, the first bit of multi-bit data may be read by applying a read voltage to one of the memory cells to read the first bit of multi-bit data.

In some embodiments of the present invention, the first bit of multi-bit data may correspond to a least significant bit (LSB) of the multi-bit data and the second bit of multi-bit data may correspond to a most significant bit (MSB) of the multi-bit data. The multi-bit data may include data having one of state "0", state "1", state "2" and state "3", wherein each of the states has a different threshold voltage and wherein an MSB of state "0" is 1 and an LSB of state "0" is 1, an MSB of state "1" is 0 and an LSB of state "1" is 1, an MSB of state "2" is 0 and an LSB of state "2" is 0 and an MSB of state "3" is 1 and an LSB of state "3" is 0.

In further embodiments of the present invention, programming the second bit of multi-bit data may include loading inverted data from the storage unit and programming the second bit of multi-bit data into one of the plurality of memory cells based on the loaded inverted data such that the second bit of multi-bit data is programmed with a maximum of two read operations.

In still further embodiments of the present invention, programming a first bit of multi-bit data from the storage unit may include loading the multi-bit data and programming the first bit of the multi-bit data into one of the plurality of memory cells. It may be determined if a the first bit of the multi-bit data has been correctly programmed. A level of the programmed first bit of multi-bit data may be incrementally changed if the first bit of multi-bit data has not been correctly programmed until it is determined that the first bit of multi-bit data has been correctly programmed or a maximum number of verification cycles has been exceeded. In certain embodiments of the present invention the storage unit may be reset before the multi-bit data is loaded.

In some embodiments of the present invention, the storage unit may include a combination of a single latch page buffer and a buffer random access memory (RAM). The first bit of multi-bit data may be stored in the single latch page buffer and the second bit of multi-bit data may be stored in the buffer RAM. In certain embodiments of the present invention, the preprogrammed data may also stored in the single latch page buffer.

In further embodiments of the present invention, the storage unit may include first and second page buffers. The first bit of multi-bit data may be stored in the first page buffer and the second bit of multi-bit data may be stored in the second page buffer. In certain embodiments of the present invention, the first page buffer may be an upper page buffer and the second page buffer may be a lower page buffer.

In still further embodiments of the present invention, the storage unit may include a double latch page buffer including first and second latches. The first bit of multi-bit data may be stored in the first latch of the double latch page buffer and the second bit of multi-bit data may be stored in the second latch of the double latch page buffer.

Some embodiments of the present invention provide methods of programming a multi-bit non-volatile memory device. The multi-bit non-volatile memory device includes a memory cell array including a plurality of memory cells and a storage unit electrically coupled to the memory cell array. The method includes programming a first bit of multi-bit data from the storage unit into one of the plurality of memory cells in the memory cell array. A second bit of multi-bit data may be programmed from the storage unit into one of the plurality of memory cells in the memory cell array using data inversion. Programming the second bit of multi-bit data using data inversion may include inverting the second bit of multi-bit data and executing inverted second bit of multi-bit data program.

Further embodiments of the present invention provide multi-bit non-volatile memory devices including a memory cell array and a storage unit. The memory cell array includes a plurality of memory cells. The storage unit is electrically coupled to the memory cell array. The memory device is configured to program a first bit of multi-bit data from the storage unit into one of the plurality of memory cells in the memory cell array and program a second bit of multi-bit data from the storage unit into one of the plurality of memory cells in the memory cell array using data inversion.

In still further embodiments of the present invention, the storage unit may include a combination of a single latch page buffer and a buffer random access memory (RAM). The first bit of multi-bit data may be stored in the single latch page buffer and the second bit of multi-bit data being stored in the buffer RAM. The preprogrammed data may be stored in the single latch page buffer.

In some embodiments of the present invention, the storage unit may include first and second page buffers. The first bit of multi-bit data may be stored in the first page buffer and the second bit of multi-bit data may be stored in the second page buffer. The first page buffer may be an upper page buffer and the second page buffer may be a lower page buffer.

In further embodiments of the present invention, the storage unit may include a double latch page buffer including first and second latches. The first bit of multi-bit data may be stored in the first latch of the double latch page buffer and the second bit of multi-bit data may be stored in the second latch of the double latch page buffer.

In still further embodiments of the present invention, using data inversion may allow the second bit of multi-bit data to be programmed into the memory cell with two read operations.

In some embodiments of the present invention, the memory device may be further configured to execute a first SB program using data inversion, execute a second SB program and execute a third SB program to provide the second bit of multi-bit data.

BRIEF DESCRIPTION OF THE DRAWINGS

FIG. 9 is a schematic block diagram illustrating page buffer operation during LSB programming of FIG. 5 according to some embodiments of the present invention.

FIG. 11 is a schematic block diagram illustrating MSB "10" page buffer operation of FIG. 10 according to some embodiments of the present invention.

FIG. 13 is a schematic block diagram illustrating MSB "00" page buffer operation of FIG. 12 according to some embodiments of the present invention.

DETAILED DESCRIPTION

Figure 1:
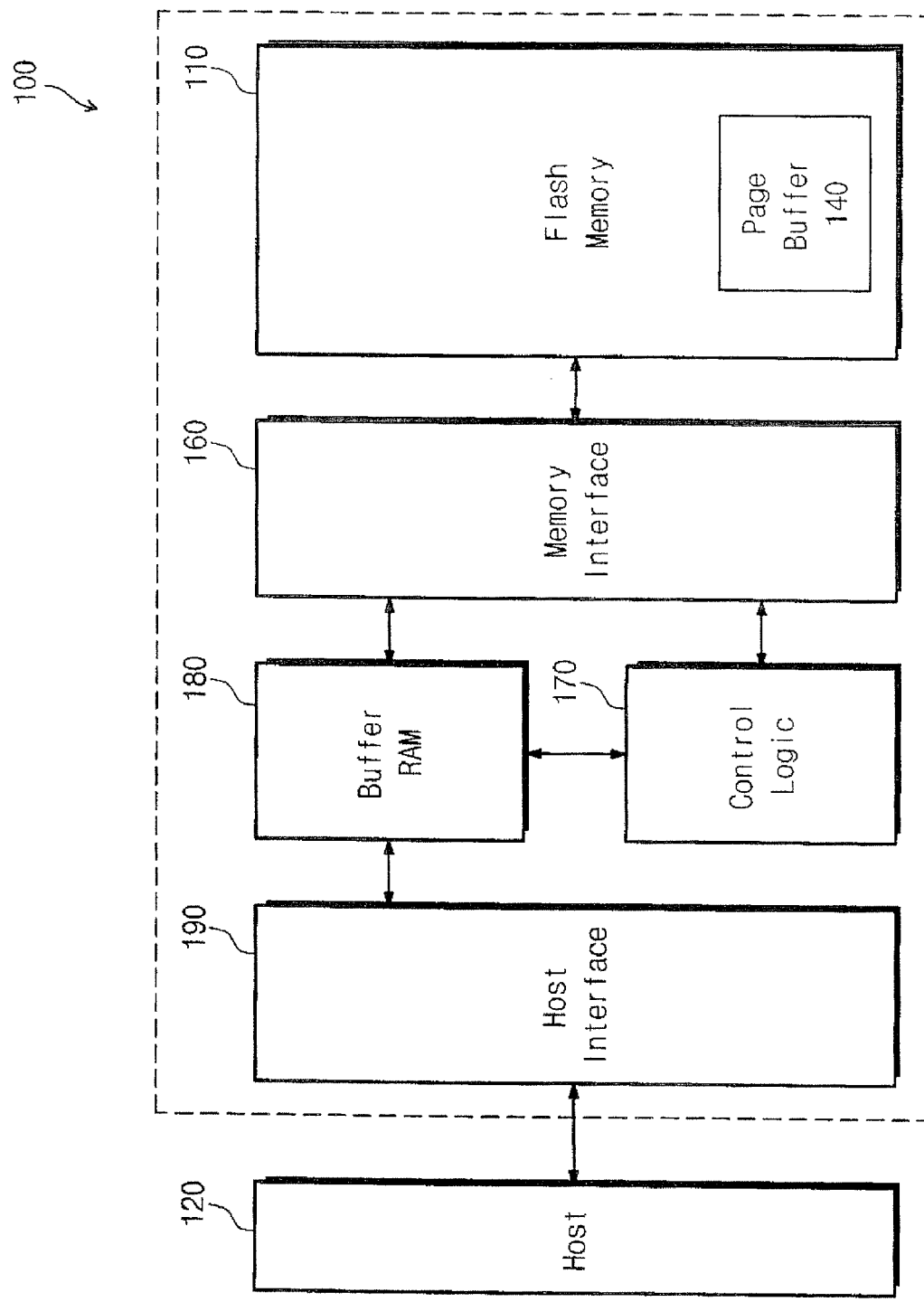
FIG. 1 is a block diagram illustrating a flash memory system including a multi-level cell (MLC) flash memory according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes or configurations of elements may be idealized or exaggerated for clarity.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, component or section. Thus, a first element, component or section discussed below could be termed a second element, component or section without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

As will be discussed below with respect to FIGS. 1 through 20, some embodiments of the present invention provide methods of programming multi-bit non-volatile memory devices and related devices. The multi-bit non-volatile memory device includes a memory cell array including a plurality of memory cells and a storage unit electrically coupled to the memory cell array. A first bit (FB) of multi-bit data is programmed from the storage unit into one of the plurality of memory cells in the memory cell array and a second bit (SB) of multi-bit data is programmed from the storage unit into one of the plurality of memory cells in the memory cell array using data inversion. The use of data inversion for programming the second bit of multi-bit data according to some embodiments of the present invention may allow the multi-bit data to be read with only two read operations, thus decreasing the number of reads required in conventional methods as will be discussed further herein with respect to FIGS. 1 through 20.

Referring first to FIG. 1, a flash memory system 100 including a multi-level cell (MLC) flash memory according to some embodiments of the present invention will be discussed. As illustrated in FIG. 1, the system 100 includes a multi-bit flash memory device 105 coupled to an external host device 120. As further illustrated in FIG. 1, the flash memory device 105 includes a memory 110, a memory interface 160, a buffer RAM 180, control logic 170 and a host interface 190. In some embodiments of the present invention, the host interface 190 between the multi-bit flash memory device 105 and the external host device 120 may be a NOR interface. It will be understood that the flash memory device 105 can be any flash memory device capable of operating as discussed herein. For example, in some embodiments of the present invention, the flash memory device could be a NAND or a NOR flash memory device without departing from the scope of the present invention. In some embodiments of the present invention, the flash memory device 105 may be a OneNAND flash memory device. The OneNAND flash memory device includes a NAND cell array and a NOR interface between the flash memory device 105 and the host 120.

Figure 2:
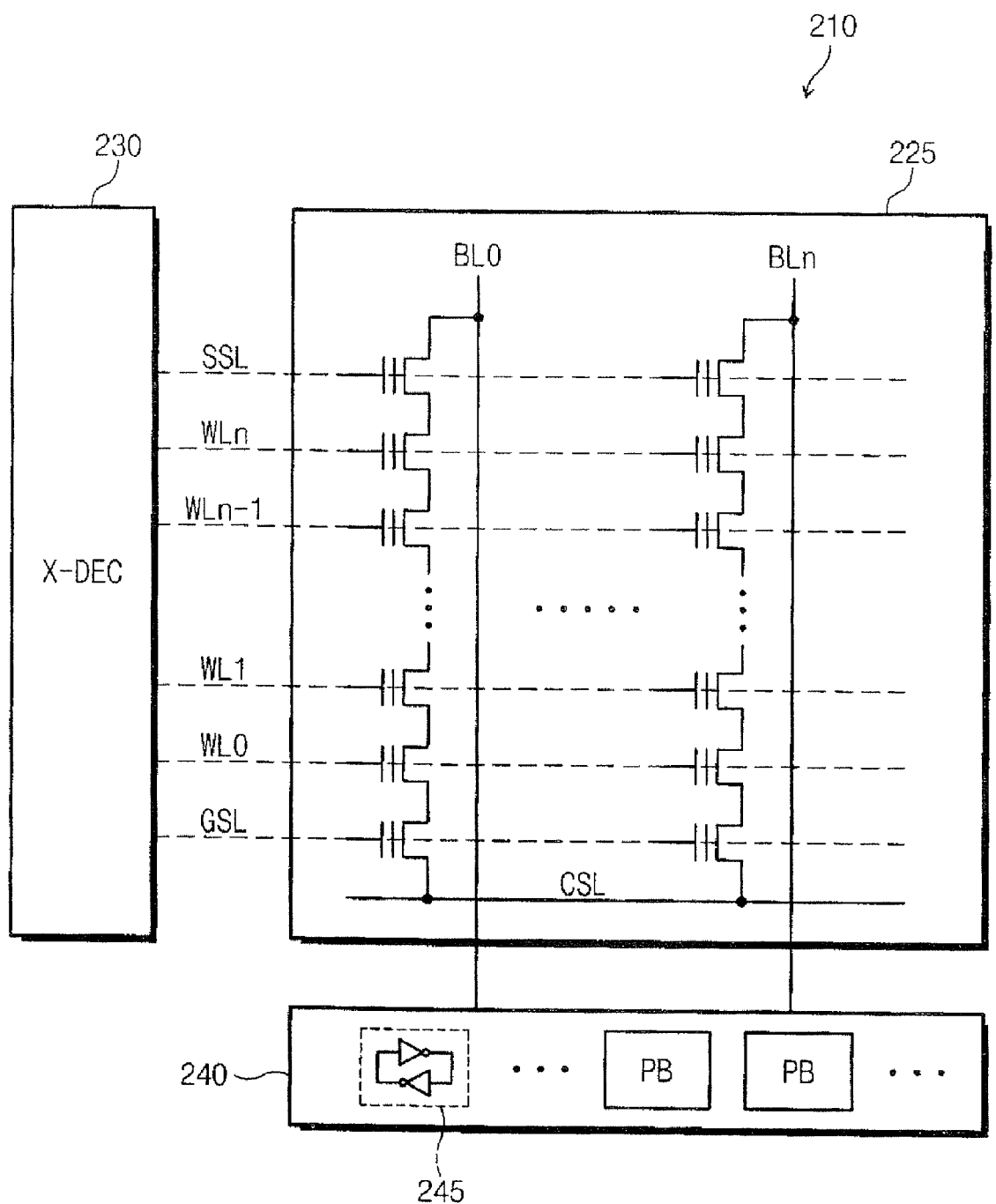
FIG. 2 is a more detailed block diagram illustrating the MLC flash memory of FIG. 1 according to some embodiments of the present invention.

As further illustrated in FIG. 1, the memory 110 may include a page buffer 140 according to some embodiments of the present invention. Referring now to FIG. 2, a more detailed block diagram illustrating the MLC flash memory of FIG. 1 according to some embodiments of the present invention will be discussed. As illustrated in FIG. 2, the memory 210 may include a memory cell array 225, a row decoder 230 and a page buffer 240. As further illustrated, the memory cell array 225 may include one or more memory cells. In some embodiments of the present invention, the memory cell array 225 may include a string cell of NAND flash memory. The page buffer 240 is electrically coupled to the memory cell array 225 and the buffer RAM 180 (of FIG. 1). In some embodiments of the present invention, the page buffer 240 may include one or more single latches 245, which are configured to store a first bit of multi-bit data to be written into or read out from one of the memory cells of the memory cell array 225. In some embodiments of the present invention, the first bit of multi-bit data may be the least significant bit (LSB) of multi-bit data. The page buffer 240 is also configured store intermediate program data during the programming operation (write operation) as will be further discussed below. Thus, the page buffer 240 according to some embodiments of the present invention may operate as a driver during a write (program) operation and as a sense amplifier during a read operation.

Referring now to FIGS. 1 and 2, as further illustrated, the buffer RAM 180 is electrically coupled to the page buffer 240. The buffer RAM 180 is configured to store a second bit of the multi-bit data to be written into or read out from one of the memory cells of the memory cell array 225. In some embodiments of the present invention, the second bit of multi-bit data is the most significant bit (MSB) of multi-bit data. In some embodiments of the present invention, the program data may include MSB intermediate program (write) data as will be discussed further below. In some embodiments of the present invention, the buffer RAM 180 may include static RAM (SRAM) or dynamic RAM (DRAM).

The use of the buffer ram in combination with a single latch page buffer according to some embodiments of the present invention is discussed in detail in commonly assigned U.S. patent application Ser. No. 11/801,792, filed on May 11, 2007 entitled MULTI-BIT FLASH MEMORY DEVICES HAVING A SINGLE LATCH STRUCTURE AND RELATED PROGRAMMING METHODS, SYSTEMS AND MEMORY CARDS, the disclosure of which is hereby incorporated herein by reference as if set forth in its entirety. As discussed therein, the buffer RAM occupies significantly less space than the latches of the page buffer. Therefore, by only including a page buffer 240 having single latches, rather than the conventional double latch, some embodiments of the present invention may provide a more compact and integrated memory device. Thus, memory devices according to some embodiments of the present invention may be suitable for use in small portable devices, such as mobile terminals and the like.

Referring again to FIG. 1, the control logic block 170 contains the control signals configured to begin and end a programming (write) operation and/or a read operation. For example, the buffer RAM 180 may be configured to temporarily store data from the memory cell array 225 through the page buffer 140 in response to a control signal generated by the control logic block 170. Operations of control logic blocks are known to those having skill in the art and will not be discussed in further detail herein in the interest of brevity.

Although embodiments of the present invention discussed with respect to FIGS. 1 and 2 include a buffer RAM 180 and a page buffer 140 as the storage unit, embodiments of the present invention are not limited to this configuration. It will be understood that embodiments of the present invention may include any storage unit configured in accordance with embodiments of the present invention. The storage unit is electrically coupled to the memory cell array 225 and configured to store the multi-bit data.

For example, in some embodiments of the present invention, the storage unit includes a combination of a single latch page buffer and a buffer random access memory (RAM), the first bit of multi-bit data being stored in the single latch page buffer and the second bit of multi-bit data being stored in the buffer RAM as discussed above and in U.S. patent application Ser. No. 11/801,792 incorporated by reference above. In these embodiments of the present invention, the preprogrammed data may be stored in the single latch page buffer.

Figure 16:
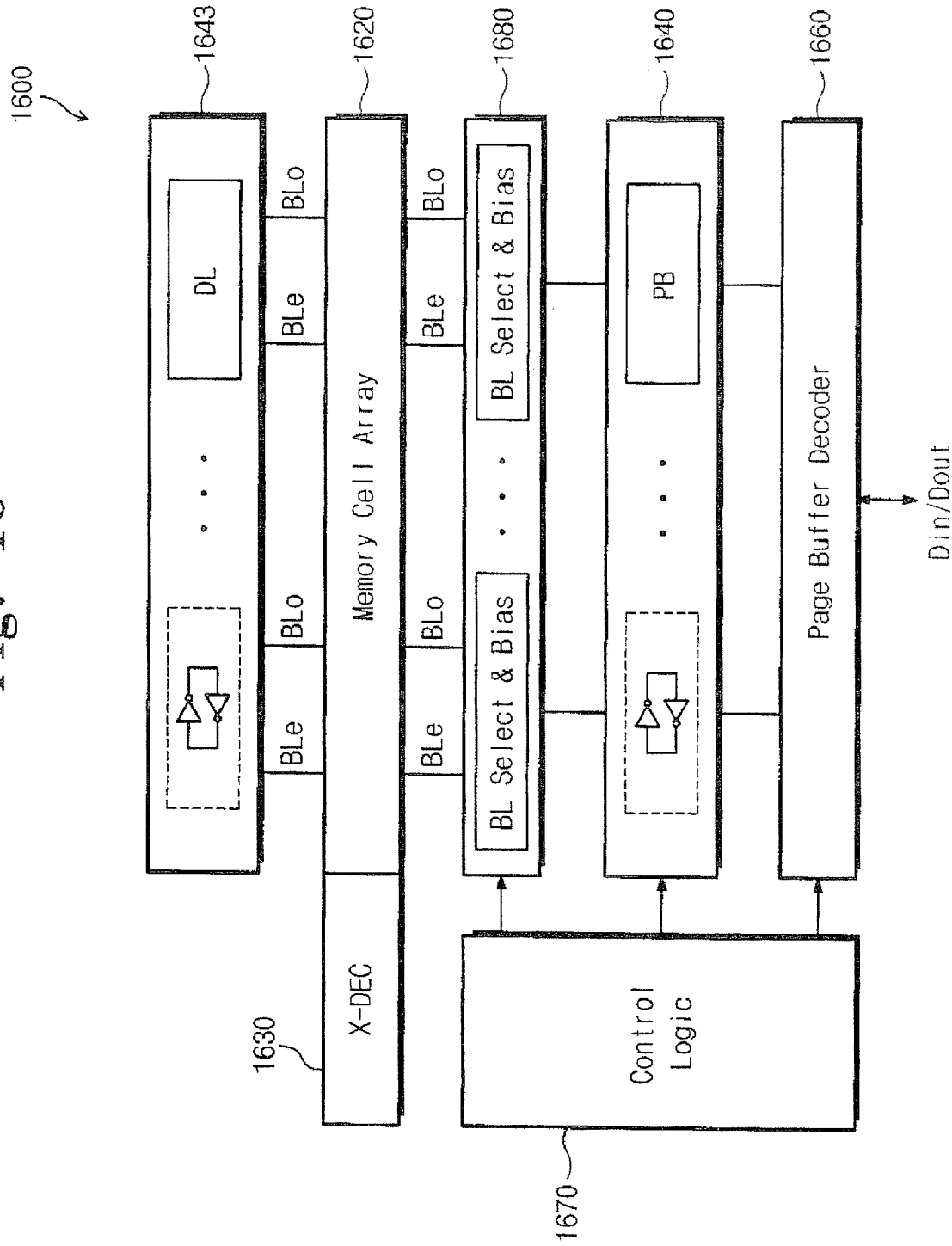
FIG. 16 is a block diagram illustrating flash memory devices according to further embodiments of the present invention.

In further embodiments of the present invention, the storage unit may include first and second page buffers 1640 and 1643 as illustrated in FIG. 16. In particular, in embodiments of the present invention illustrated in FIG. 16, the first bit of multi-bit data may be stored in one of the page buffers 1640, 1643 and the second bit of multi-bit data may be stored in a second of the page buffers 1640, 1643. In some embodiments of the present invention, the first and second page buffers may be upper 1643 and lower 1640 page buffers as illustrated in FIG. 16.

Figure 17:
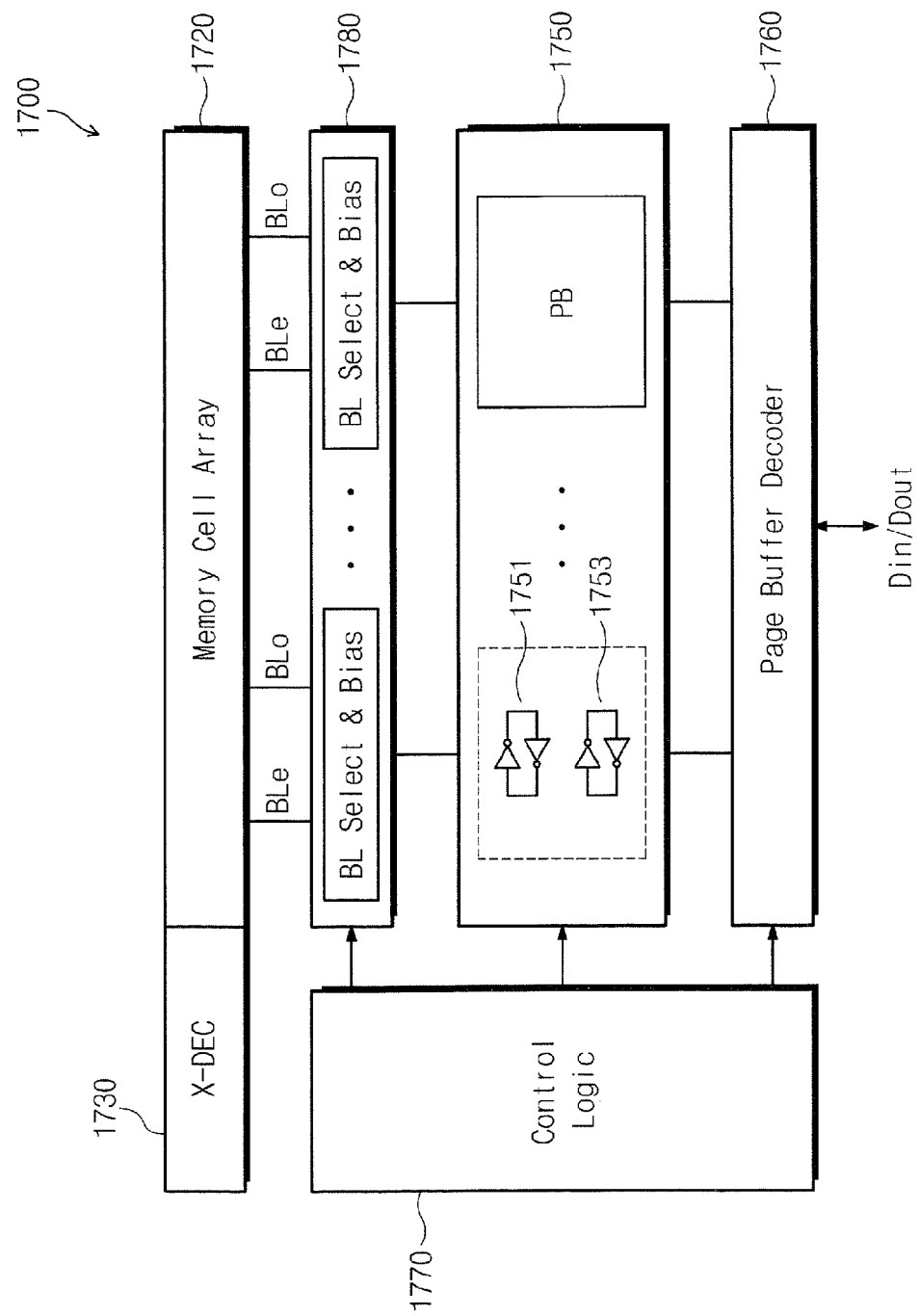
FIG. 17 is a block diagram illustrating flash memory devices according to still further embodiments of the present invention.

In still further embodiments of the present invention, the storage unit may include a double latch page buffer 1750 including first and second latches as illustrated in FIG. 17. The first bit of multi-bit data may be stored in the first latch 1751 of the double latch page buffer and the second bit of multi-bit data 1753 may be stored in the second latch of the double latch page buffer 1750.

Although embodiments of the present invention are discussed above with respect to a two bit multi-bit data having an MSB and an LSB, embodiments of the present invention are not limited to this configuration. Three or more bit multi-bit data may be used without departing from the scope of the present invention.

Figure 3:
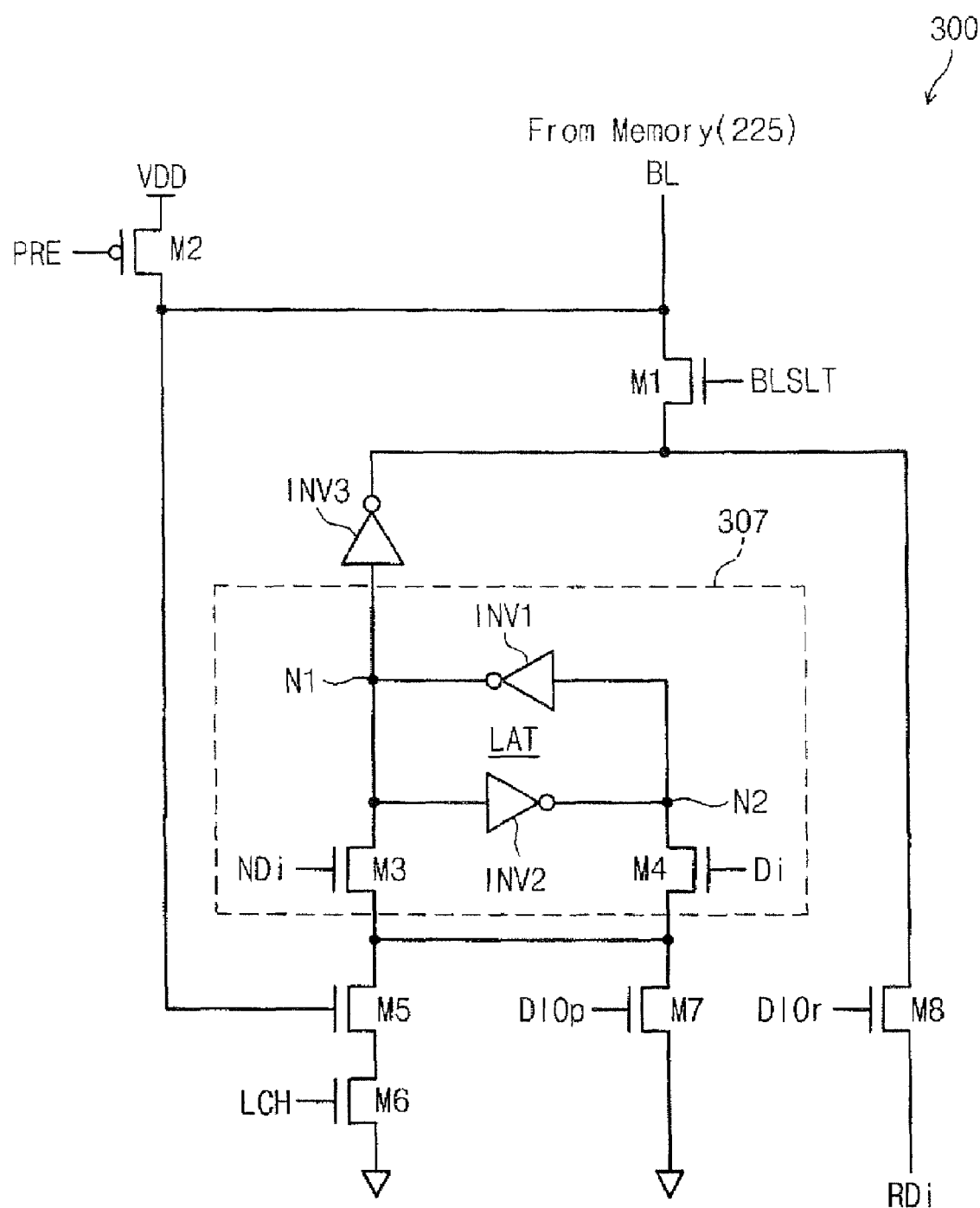
FIG. 3 is a block diagram illustrating a page buffer according to some embodiments of the present invention.

Referring now to FIG. 3, a schematic block diagram of a page buffer according to some embodiments of the present invention will be discussed. As illustrated in FIG. 3, a page buffer 300 includes a PMOS transistor M2, first through seventh NMOS transistors M1 and M3 through M8 and three invertors INV1 through INV3 connected as shown in FIG. 3. The single latch structure 307 according to embodiments of the present invention includes first and second invertors INV1 and INV2 connected as shown. It will be understood that FIG. 3 illustrates a single page buffer cell. Memory devices according to embodiments of the present invention may include a plurality of these cells as illustrated in the page buffer 245 of FIG. 2. The page buffer operates responsive to a precharge signal PRE, data received from the memory cell array 225 (FIG. 2) on the bit line (BL), a bit line select signal (BLSLT), data and inverse data signals NDi, Di, DIOp and DIOr and a latch signal (LCH). It will be understood that when DIOp is high a programming operation is being preformed and when DIOr is high a reading operation is being performed. Circuits such as the page buffer of FIG. 3 are known to those having skill in the art and, therefore, details with respect to the operation thereof will be omitted herein in the interest of brevity.

Figure 4:
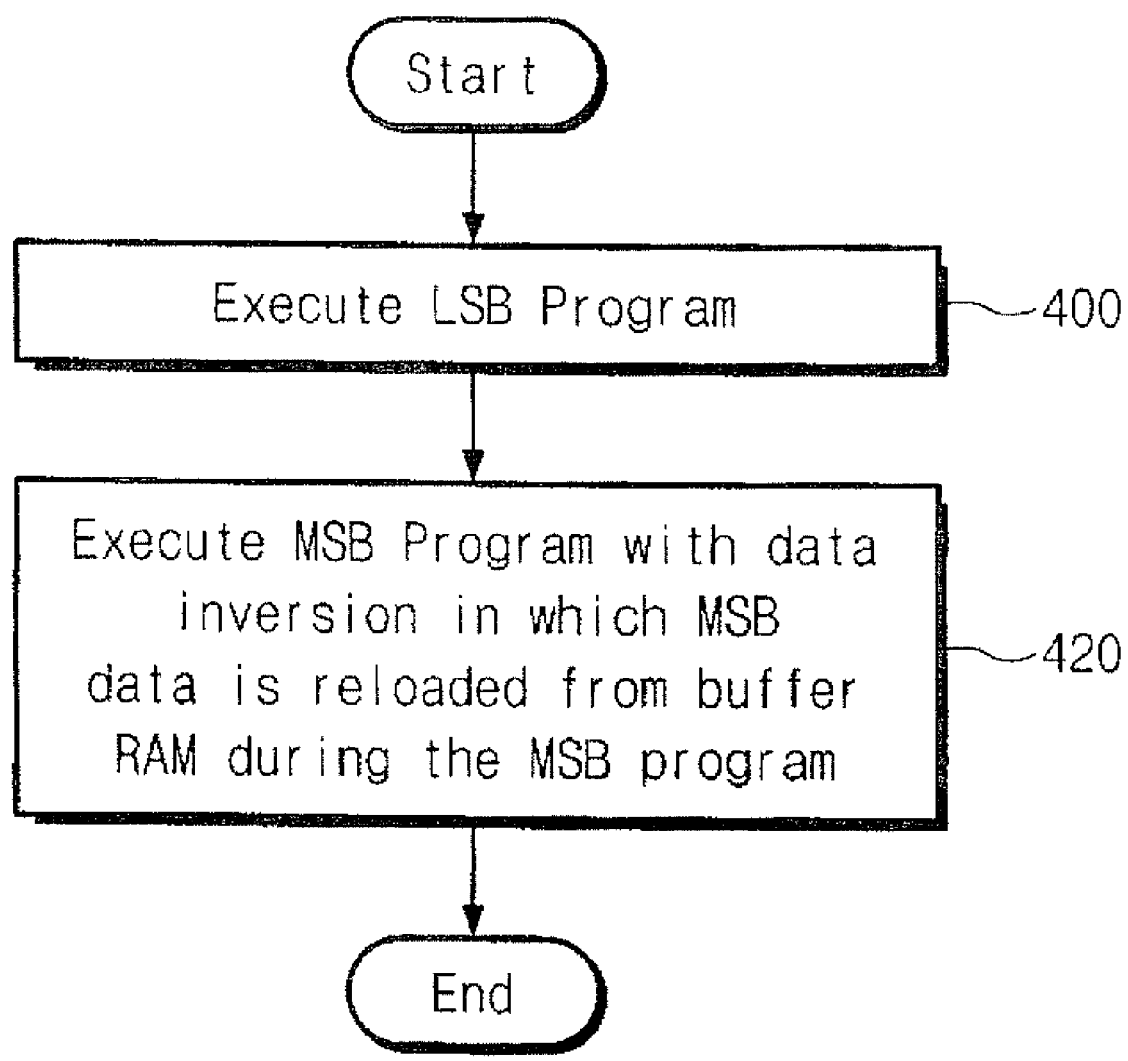
FIG. 4 is a flowchart illustrating operations of a multi-bit program of a multi-bit flash memory according to some embodiments of the present invention.

Referring now to FIG. 4, a flowchart illustrating operations of programming methods (writing operations) according to some embodiments of the present invention will be discussed. Methods of programming multi-bit non-volatile memory devices according to some embodiments of the present invention are performed in multi-bit non-volatile memory devices including a memory cell array including a plurality of memory cells and a storage unit electrically coupled to the memory cell array as discussed above with respect to FIGS. 1 through 3 and 16 and 17. As illustrated in FIG. 4, operations begin at block 400 by programming a first bit (FB) of multi-bit data from the storage unit into one of the plurality of memory cells in the memory cell array. The first bit of multi-bit data may be the least significant bit (LSB) according to some embodiments of the present invention. Thus, operations of block 400 may be executing the LSB program as will be further discussed below. Operations continue at block 420 by programming a second bit (SB) of multi-bit data from the storage unit into one of the plurality of memory cells in the memory cell array using data inversion. The second bit of multi-bit data may be the most significant bit (MSB) in some embodiments of the present invention. Thus, operations of block 420 may be executing an MSB program using data inversion. It will be understood that executing of the MSB program (block 420), the data may be reloaded from the buffer RAM 180 (FIG. 1) to the page buffer 140 in accordance with some embodiments of the present invention.

Figure 5:
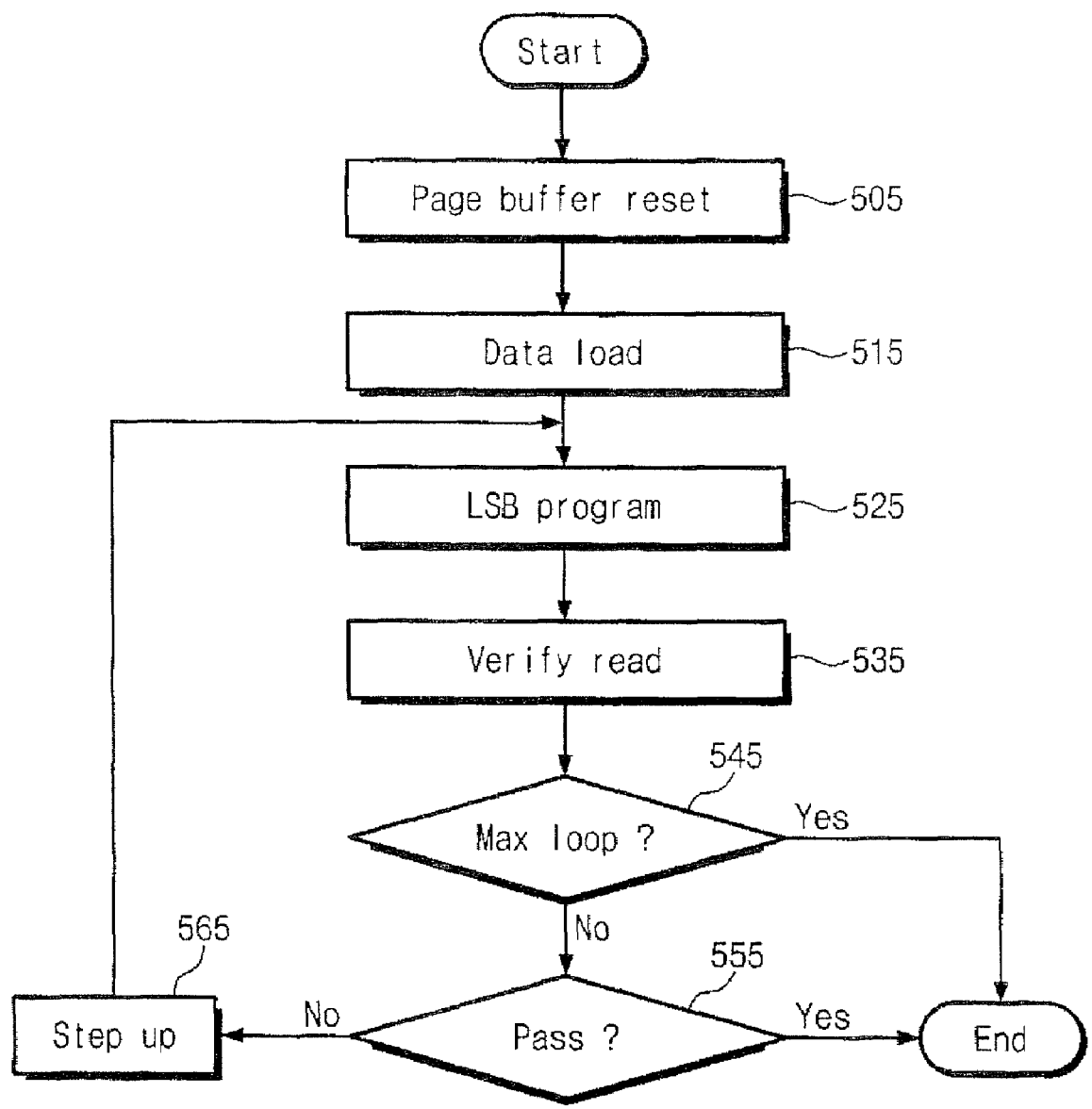
FIG. 5 is a flowchart illustrating operations of the LSB program of FIG. 4 according to some embodiments of the present invention. (MODIFY THIS FIGURE)
Figure 7:
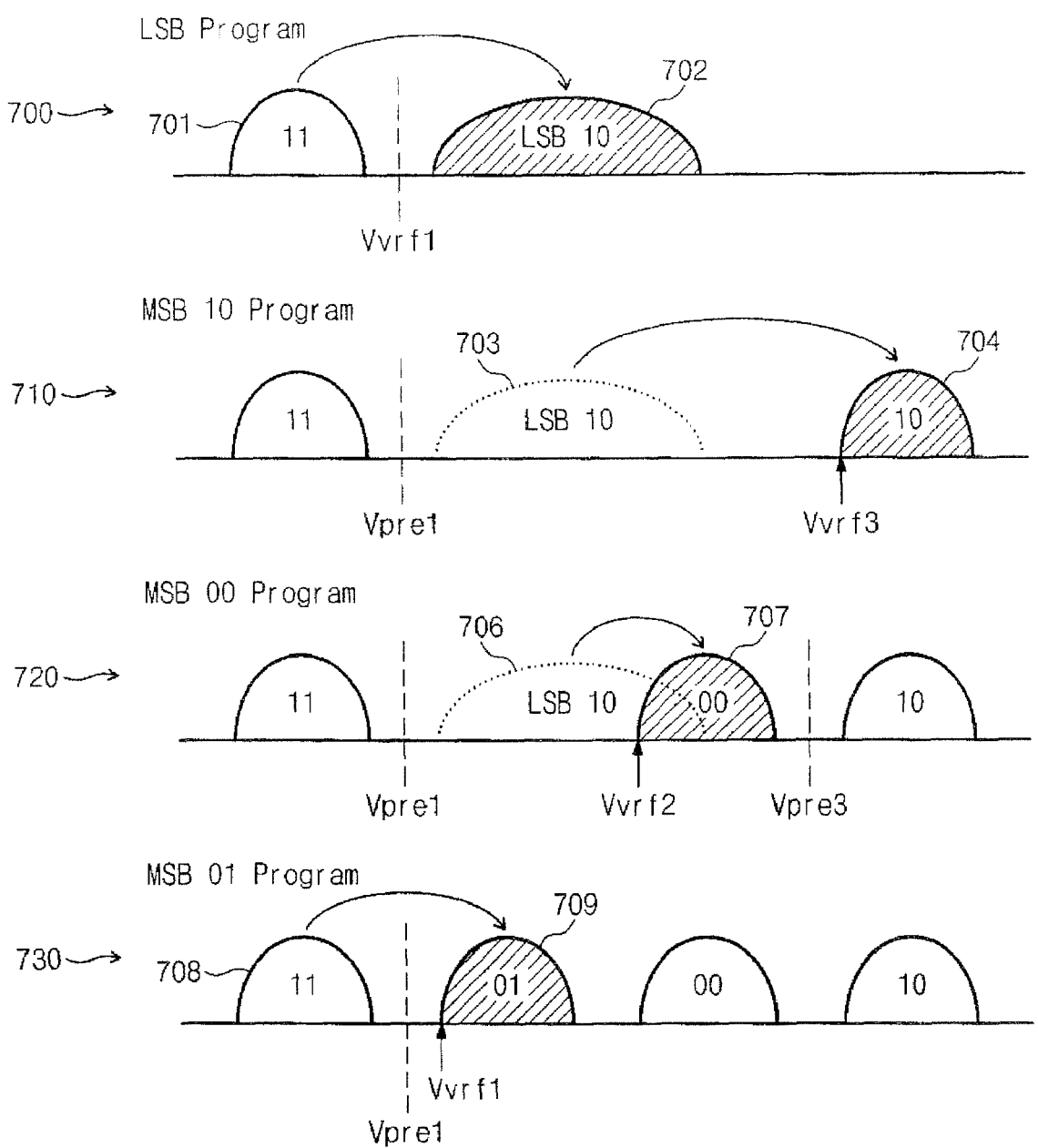
FIG. 7 is a diagram illustrating a flash memory status distribution according to embodiments of the present invention illustrated in FIGS. 5 through 7.

Operations of the LSB program according to some embodiments of the present invention will now be discussed with respect to FIGS. 5 and 7. As illustrated in FIG. 5, operations begin at block 505 by resetting the page buffer and then loading the data (block 515). The LSB program is executed (block 525). As illustrated in FIG. 7, the cell threshold voltage distribution begins at "11" 701 (the erase state). A verify read is performed using a read word line voltage (Vvrfl) as shown in FIG. 7 (block 535). It is determined if the maximum number of iterations have been reached for the LSB program (block 545). If it is determined that the maximum number of iterations has been reached (block 545), operations of the LSB program terminate. If, on the other hand, it is determined that the maximum number of iterations has not been reached (block 545), it is determined if the cell threshold voltage distribution is "10" (602 of FIG. 7) (block 555). If it is determined that the cell threshold voltage distribution is "10" (block 555), the LSB program has passed and operations of the LSB program are terminated. If, on the other hand, it is determined that the cell threshold distribution is not "10" (block 555), the word line voltage is stepped up (block 565) and operations of blocks 525 through 555 are repeated until either maximum number of iterations is reached (block 545) or the cell threshold voltage distribution "10" is reached (block 555). In some embodiments of the present invention, the step up program (block 565) may be an incremental step pulse program (ISPP), however, embodiments of the present invention are not limited to this configuration.

In other words, as illustrated in the diagram illustrating an LSB program 700 of FIG. 7, the LSB program begins with a cell threshold distribution voltage "11" 701 (the erase state) and ends with a cell threshold distribution of "10" 702. As illustrated by the flowchart of FIG. 5, this transition may not happen in one programming step, it may take several programming iterations before the final state "10" is achieved, i.e., before the pass (block 555) is generated.

Figure 6:
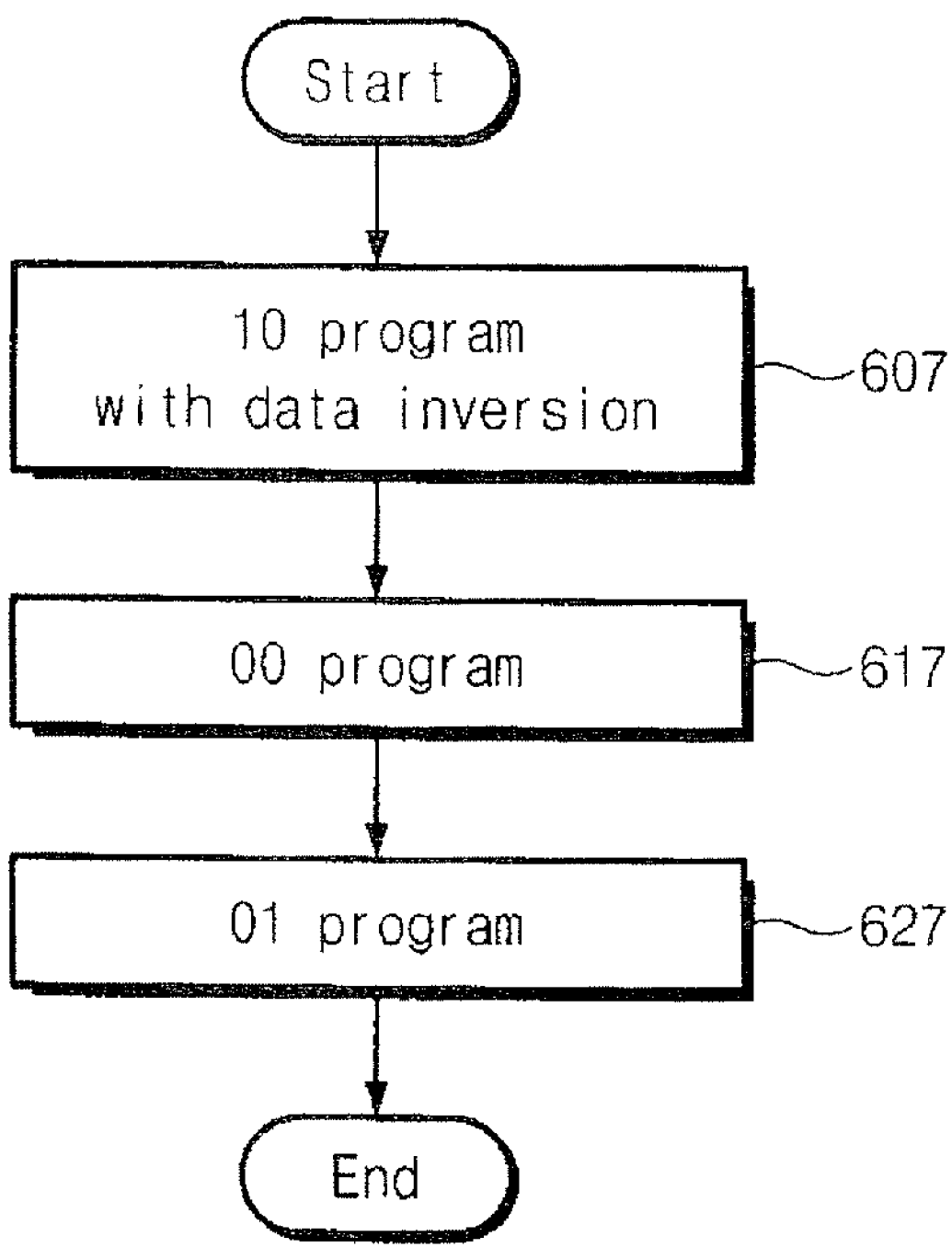
FIG. 6 is a flowchart illustrating operations of the MSB program of FIG. 4 according to some embodiments of the present invention.

Operations of the MSB program according to some embodiments of the present invention will now be discussed with respect to FIGS. 6 and 7. Referring first to FIG. 6, a flowchart illustrating operations of most significant bit (MSB) programs according to some embodiments of the present invention will be discussed. As illustrated in FIG. 6, operations begin at block 607 by executing the MSB "0" program with data inversion. In particular, as illustrated in FIG. 7, the MSB "10" program with data inversion 710 includes bringing data in one of the memory cells whose data is in LSB state "10" (703) before the MSB "10" program operation into MSB state "10" (704) after the MSB "10" program operation. It will be understood that data in the storage unit may be inverted and the MSB "10" program may be executed with using the inverted data. Thus according to embodiments of the present invention, after data inversion data "0" is inhibited and data "1" is programmed.

Once the MSB "10" program with data inversion is complete, the MSB "00" program (block 617) is preformed. As further illustrated in FIG. 7, the MSB "00" program operation 720 includes bringing one of the memory cells whose data is in LSB state "10" (706) before the MSB "00" program into state "00" (707) after the MSB "00" program.

Finally, once the MSB "00" program is complete, the MSB "01" program block 627) is performed, which provides the second bit of multi-bit data. As illustrated in FIG. 7, the MSB "01" program operation 730 includes bringing one of the memory cells whose data is in state "11" (708) before the MSB "01" program operation into state "01" (709) after the MSB "01" program operation to provide a programmed second bit of multi-bit data.

It will be understood that the FIGS. 5 through 7 are based on embodiments with two bit multi-bit data having an LSB and an MSB. Embodiments of the present invention are not limited to this configuration. For example, three or more bit multi-bit data may be used without departing from the scope of the present invention.

Figure 8:
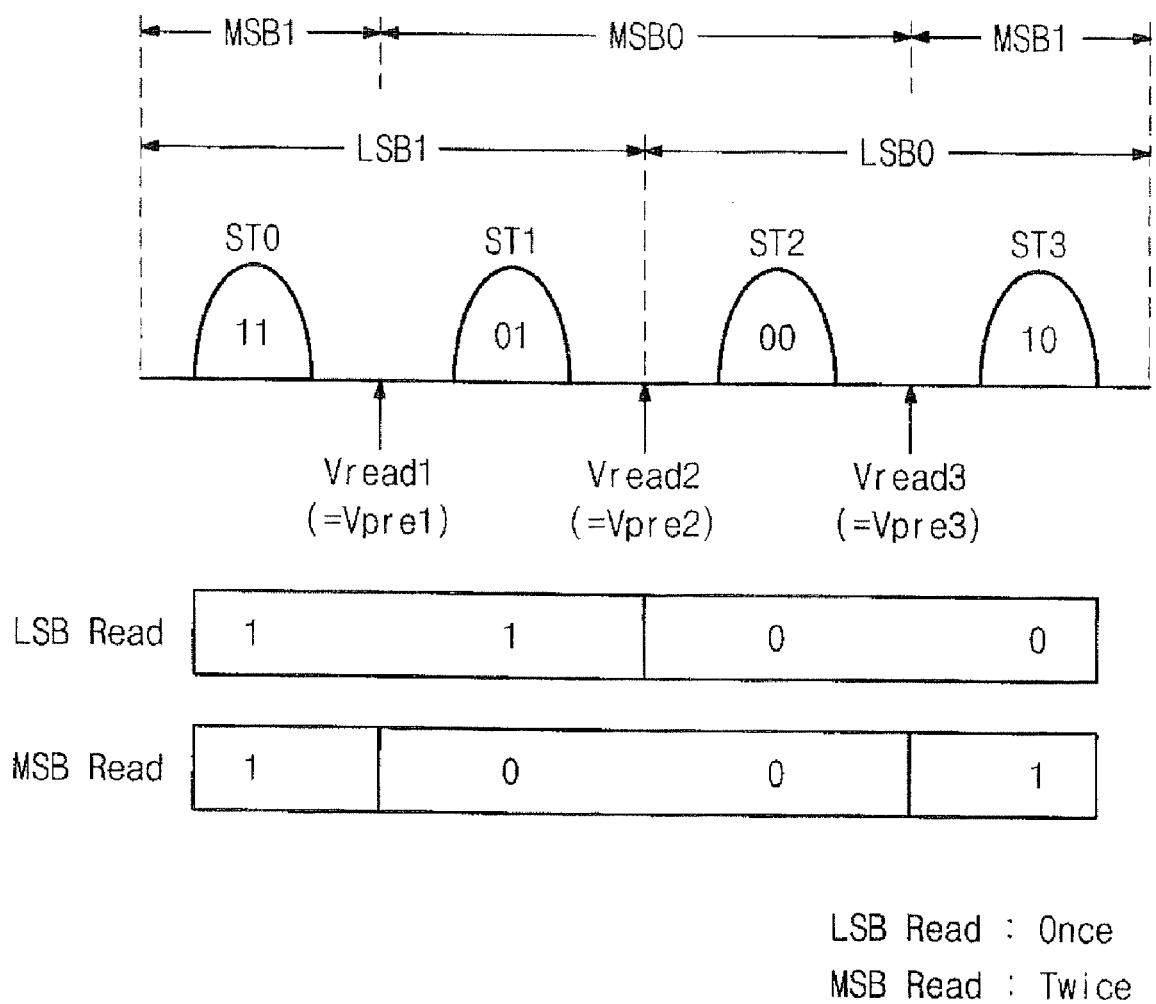
FIG. 8 is a diagram illustrating a flash memory status distribution according to embodiments of the present invention illustrated in FIGS. 5 through 7.

Thus, according to some embodiments of the present invention, use of data inversion as discussed above may allow the second bit (or MSB) of multi-bit data to be programmed into the memory cell with two read operations. This is illustrated for example the program status distribution chart of FIG. 8. In particular, reading the second bit of multi-bit data using two read operations may include applying a first read voltage to one of the memory cells to determine if the state of cell is on or off. Then, a second read voltage is applied to the one of the memory cells to read the second bit of multi-bit data in the one of the memory cells. FIG. 8 also illustrates the application of a read voltage to one of the memory cells to read the first bit (LSB) of multi-bit data in accordance with embodiments of the present invention.

As discussed herein, the multi-bit data includes data having one of state "0", state "1", state "2" and state "3." Each of the states has a different threshold voltage. In some embodiments of the present invention, an MSB of state "0" is 1 and an LSB of state "0" is 1, an MSB of state "1" is 0 and an LSB of state "1" is 1, an MSB of state "2" is 0 and an LSB of state "2" is 0 and an MSB of state "3" is 1 and an LSB of state "3" is 0.

Operations according to some embodiments of the present invention will now be discussed with respect to the schematic illustrations of page buffers of FIGS. 9, 11, 13 and 15 and the flowcharts of FIGS. 10, 12 and 14. It will be understood that the page buffers illustrated in FIGS. 9, 11, 13 and 15 are the same page buffer that is illustrated in FIG. 3, but includes additional information with respect to the various programming stages as will be discussed further herein.

Referring first to FIG. 9, a schematic diagram illustrating a page buffer during an LSB program according to some embodiments of the present invention will be discussed. Operations of the page buffer 900 will be discussed in combination with the flowchart of FIG. 5. As illustrated in FIG. 9, the paths labeled (1) and (1') correspond to a reset of the page buffer 900. The partial circuit 910 illustrated in FIG. 9 illustrates the values around the first through third invertors INV1 through INV3 during a reset operation. The reset operation corresponds to block 505 of FIG. 5.

The second path labeled (2) of the page buffer 900 corresponds to the data path. As illustrated by the partial circuits 915 and 920 that illustrate the values around the first through third invertors INV1 through INV3 during a data load. NDi is always low ("0") and Di is a logic low ("0" or "L") when the program data is "1" and a logic high ("1") when the program data is a "0". At this point, data "1" is inhibited and date "0" is programmed. The data load operation of the page buffer 900 corresponds to block 515 of the flowchart of FIG. 5.

Finally, the third path labeled (3) of the page buffer 900 corresponds to the programming path that programs the memory cell in the memory cell array. Programming corresponds to block 525 of the flowchart of FIG. 5.

Referring now to the flowchart of FIG. 10 and the page buffer of FIG. 11, operations of a page buffer during an MSB "10" program according to some embodiments of the present invention will be discussed. As illustrated in FIG. 11, the paths labeled (1) and (1') correspond to a reset of the page buffer 1100 and to block 1009 of the flowchart of FIG. 10. The partial circuit 1110 illustrated in FIG. 11 illustrates the values around the first through third invertors INV1 through INV3 during a reset operation.

The first path labeled (2) of the page buffer 1100 corresponds to the previous data read operation of the memory cell before the data is loaded. The partial circuits 1120 in FIG. 11 illustrate the alternative values around the first through third invertors INV1 through INV3 during a pre-read operation. Operations of the pre-read operation correspond to block 1019 of the flowchart of FIG. 10.

The second path labeled (3) of the page buffer 1100 corresponds to the data path. As illustrated by the partial circuits 1130 and 1140 which illustrate the values around the first through third invertors INV1 through INV3 during a programming operation, Di is always low and NDi is a logic high ("1") when the program data is "0" and a logic low ("0" or "L") when the program data is a "1". As discussed above, the data that is loaded in the page buffer during the MSB "10" operation is inverted. Thus, after the MSB "10" operation according to some embodiments of the present invention data "0" is inhibited and data "1" is programmed. The data load operation of the page buffer 1100 of FIG. 11 corresponds to block 1029 of the flowchart of FIG. 10.

Figure 10:
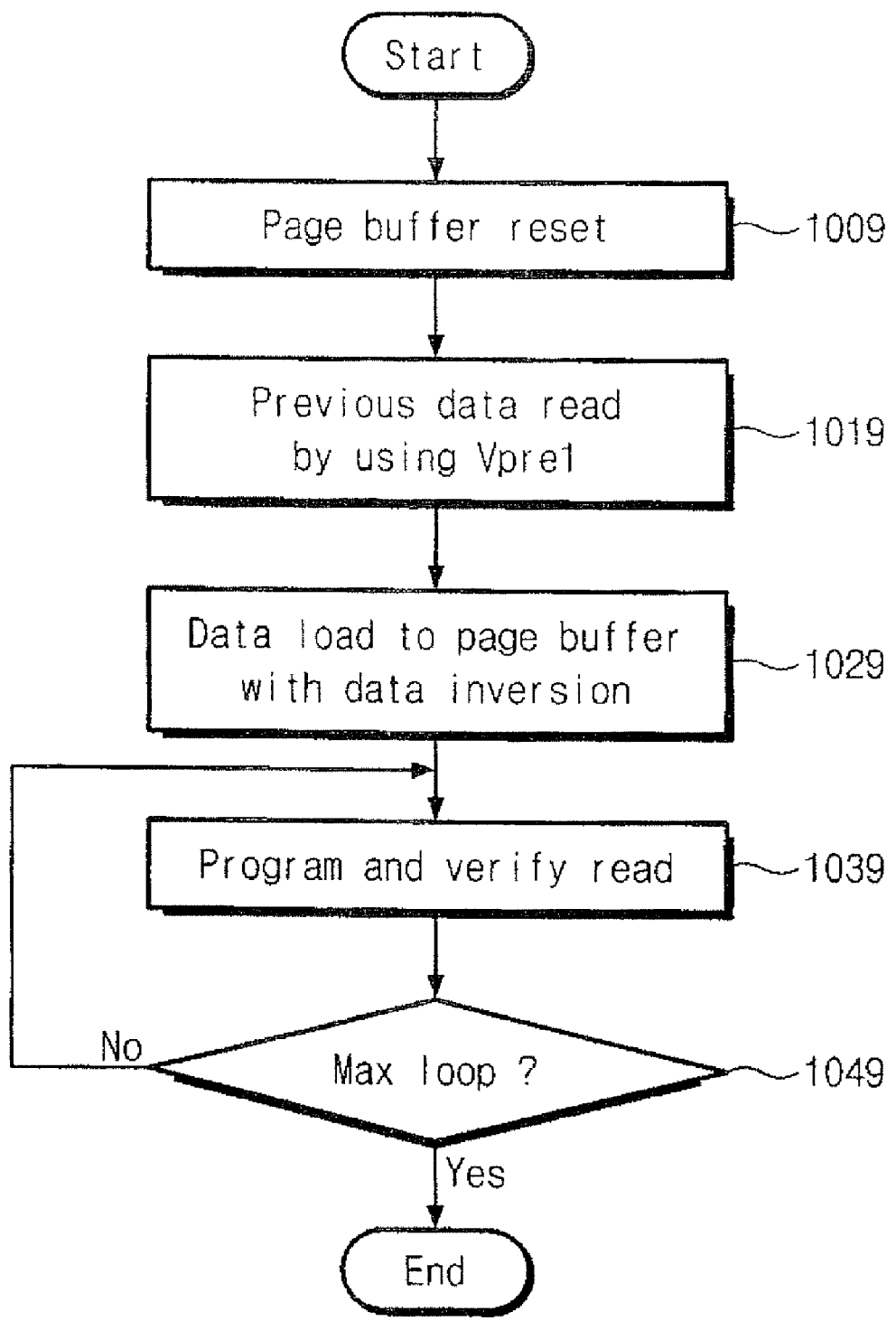
FIG. 10 is flowchart illustrating MSB "10" programming of FIG. 6 according to some embodiments of the present invention.

Finally, the fourth path labeled (4) of the page buffer 1100 corresponds to the current path that programs the memory cell in the memory cell array, which corresponds to block 1039 of the flowchart of FIG. 10.

Referring to the flowchart of FIG. 10, as discussed above with respect to FIG. 5, it is determined if the maximum number of iterations have been reached for the MSB "10" program (block 1049). If it is determined that the maximum number of iterations has been reached (block 1049), operations of the MSB "10" program terminate. If, on the other hand, it is determined that the maximum number of iterations has not been reached (block 1049), the word line voltage is stepped up and operations are repeated until either the maximum number of iterations is reached (block 1049) or the desired cell threshold voltage distribution is reached.

Referring now to the flowchart of FIG. 12 and the page buffer of FIG. 13, operations of a page buffer during an MSB "00" program according to some embodiments of the present invention will be discussed. As illustrated in FIG. 13, the path labeled (1) corresponds to a first previous data read of the page buffer 1300. The partial circuit 1310 illustrated in FIG. 13 illustrates the values around the first through third invertors INV1 through INV3 during the first previous data read operation. Operations of the first previous data read operation correspond to block 1202 of the flowchart of FIG. 12.

The first path labeled (2) of the page buffer 1300 corresponds to the second pre-read of the memory cell. The partial circuits 1320 in FIG. 13 illustrate the alternative values around the first through third invertors INV1 through INV3 during the second pre-read operation. Operations of the second previous data read correspond to block 1212 of the flowchart of FIG. 12.

Finally, the third path labeled (3) of the page buffer 1300 corresponds to the current path that programs the memory cell in the memory cell array. The programming operations of the page buffer 1300 correspond to block 1222 of FIG. 12.

Figure 12:
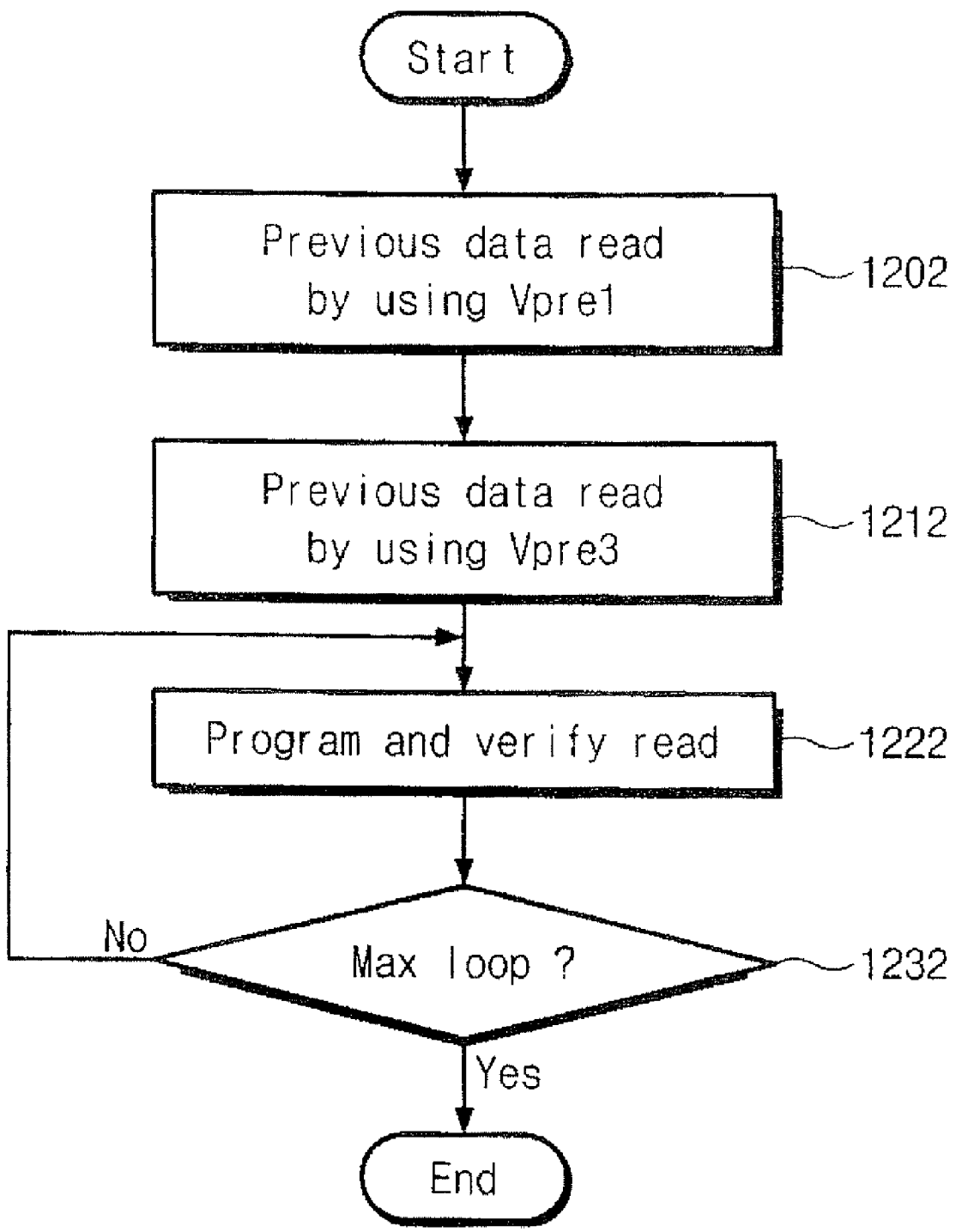
FIG. 12 is a flowchart illustrating MSB "00" programming of FIG. 6 according to some embodiments of the present invention.

Referring to the flowchart of FIG. 12, it is determined if the maximum number of iterations have been reached for the MSB "00" program (block 1232). If it is determined that the maximum number of iterations has been reached (block 1232), operations of the MSB "00" program terminate. If, on the other hand, it is determined that the maximum number of iterations has not been reached (block 1232), the word line voltage is stepped up and operations are repeated until either the maximum number of iterations is reached (block 1232) or the desired cell threshold voltage distribution is reached.

Referring now to the flowchart of FIG. 14 and the page buffer of FIG. 15, operations of a page buffer during an MSB "01" program according to some embodiments of the present invention will be discussed. As illustrated in FIG. 15, the paths labeled (3) and (3') correspond to a reset of the page buffer 1500. The partial circuit 1510 illustrated in FIG. 15 illustrates the values around the first through third invertors INV1 through INV3 during a reset operation. Operations of the reset correspond to block 1404 of the flowchart of FIG. 14.

The first path labeled (1) illustrates the previous data read according to some embodiments of the present invention. The partial circuits 1520 in FIG. 15 illustrate the alternative values around the first through third invertors INV1 through INV3 during the previous data read. Operations of the data pre-read correspond to block 1414 of the flowchart of FIG. 14.

The second path labeled (2) of the page buffer 1500 corresponds to a data load of the memory cell. The partial circuits 1530 and 1540 in FIG. 15 illustrate the alternative values around the first through third invertors INV1 through INV3 during the data load operation. Operations of the data load operation correspond to block 1424 of the flowchart of FIG. 14.

Finally, the fourth path labeled (4) of the page buffer 1500 corresponds to the current path that programs the memory cell in the memory cell array. Programming operations correspond to block 1434 of the flowchart of FIG. 14.

Figure 14:
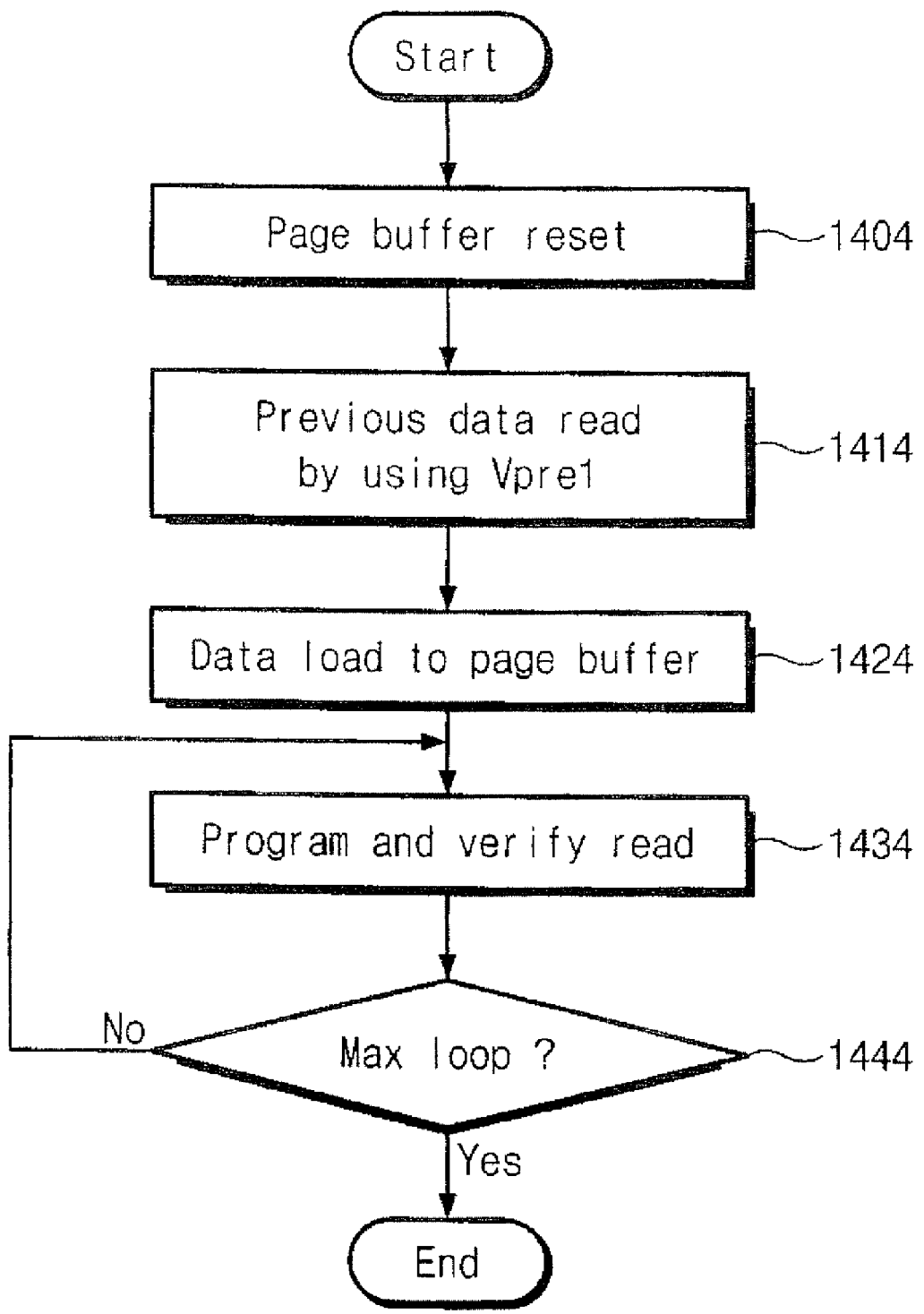
FIG. 14 is a flowchart illustrating MSB "01" programming of FIG. 6 according to some embodiments of the present invention.
Figure 15:
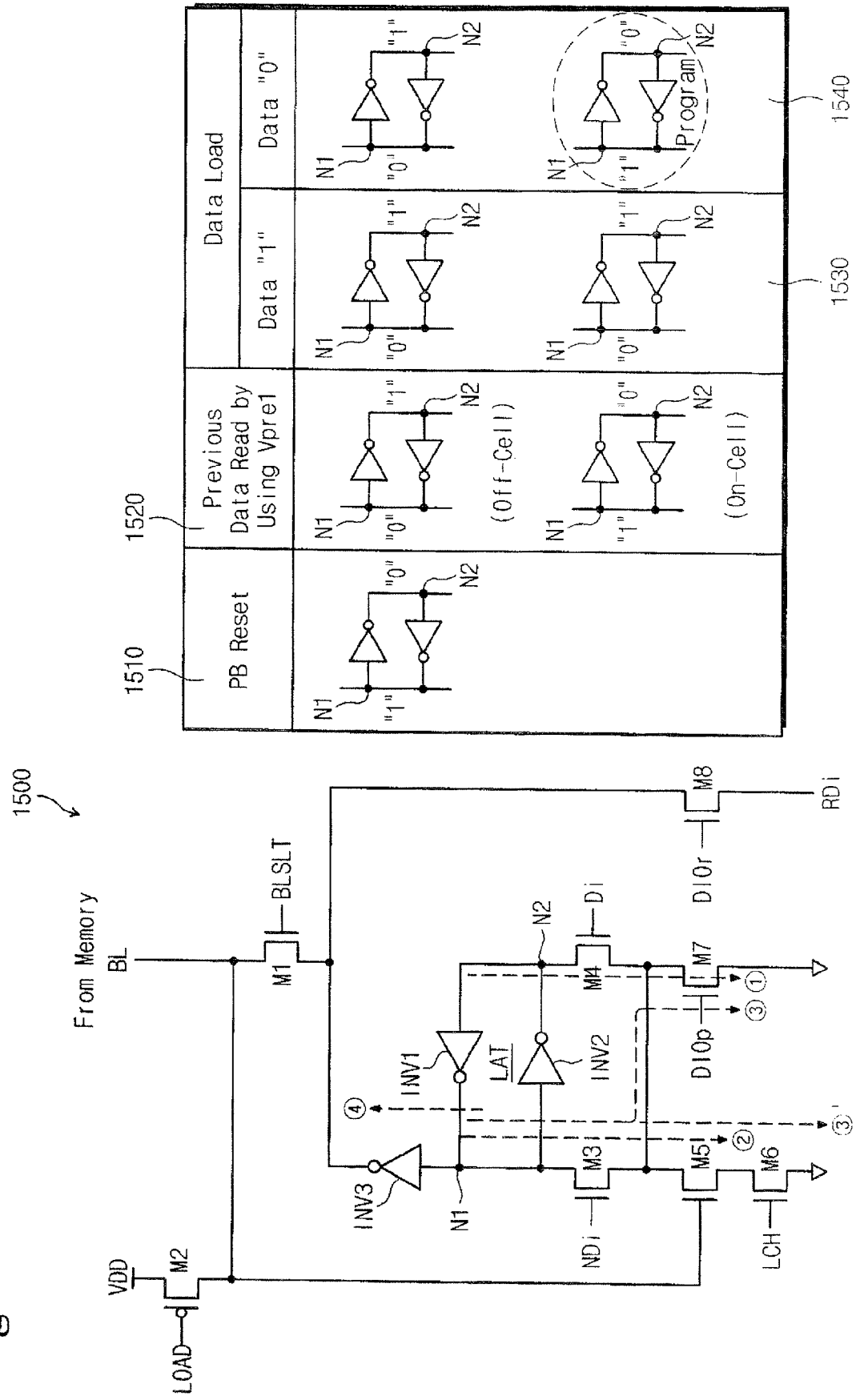
FIG. 15 is a schematic block diagram illustrating MSB "01" page buffer operation of FIG. 14 according to some embodiments of the present invention.

Referring to the flowchart of FIG. 14, it is determined if the maximum number of iterations have been reached for the MSB "01" program (block 1444). If it is determined that the maximum number of iterations has been reached (block 1444), operations of the MSB "01" program terminate. If, on the other hand, it is determined that the maximum number of iterations has not been reached (block 1444), the word line voltage is stepped up and operations are repeated until either maximum number of iterations is reached (block 1444) or the desired cell threshold voltage distribution is reached.

Figure 18:
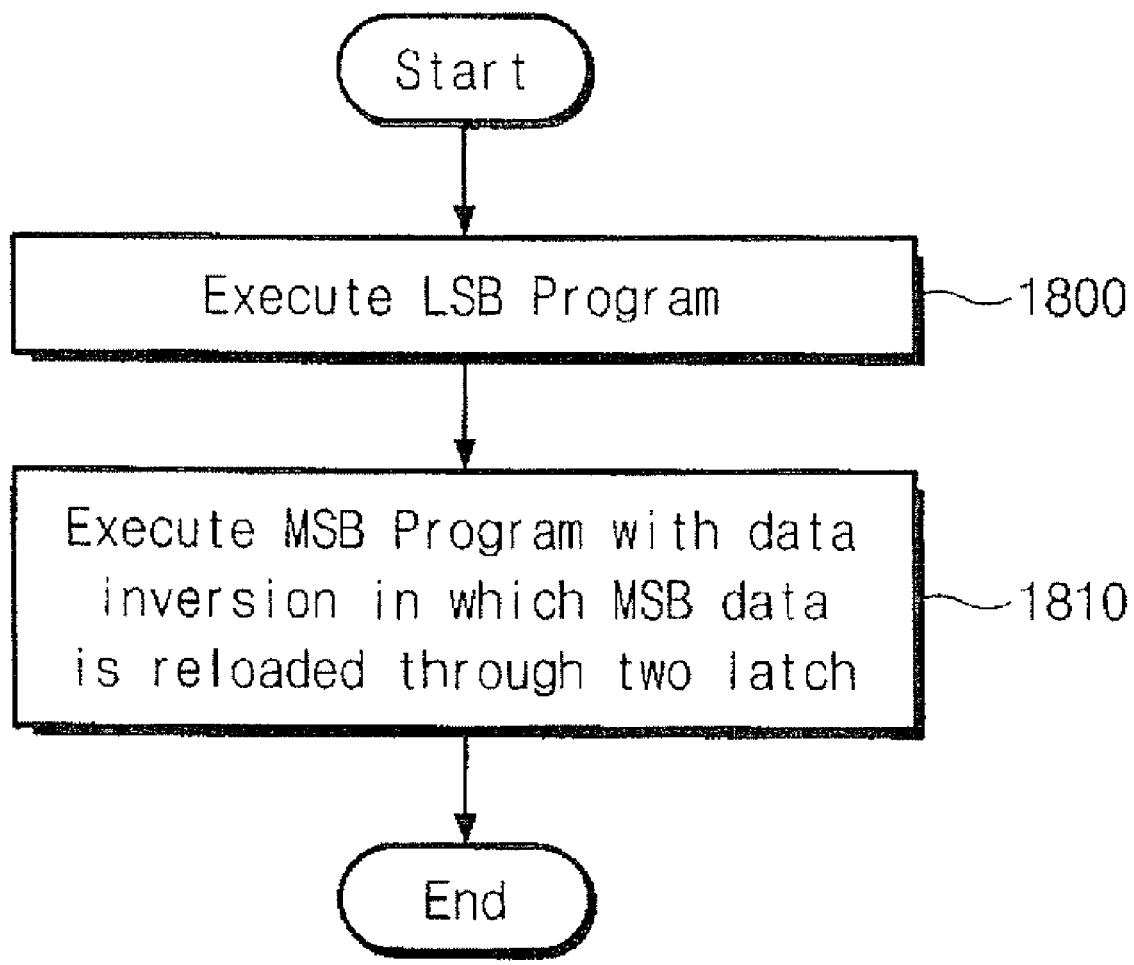
FIG. 18 is a flowchart illustrating operations of the flash memory devices illustrated in FIG. 17 according to some embodiments of the present invention.

Referring now to FIG. 18, a flowchart illustrating operations according to embodiments of the present invention including a double latch page buffer as illustrated in FIG. 17 will be discussed. Operations begin at block 1800 by executing the LSB program. Processing steps in the execution of the LSB program will be discussed further with respect to the flowchart of FIG. 19. The MSB program is executed using data inversion where the MSB data is reloaded through the two (double) latch page buffer. Operations of the MSB program will be discussed further with respect to FIG. 20.

Figure 19:
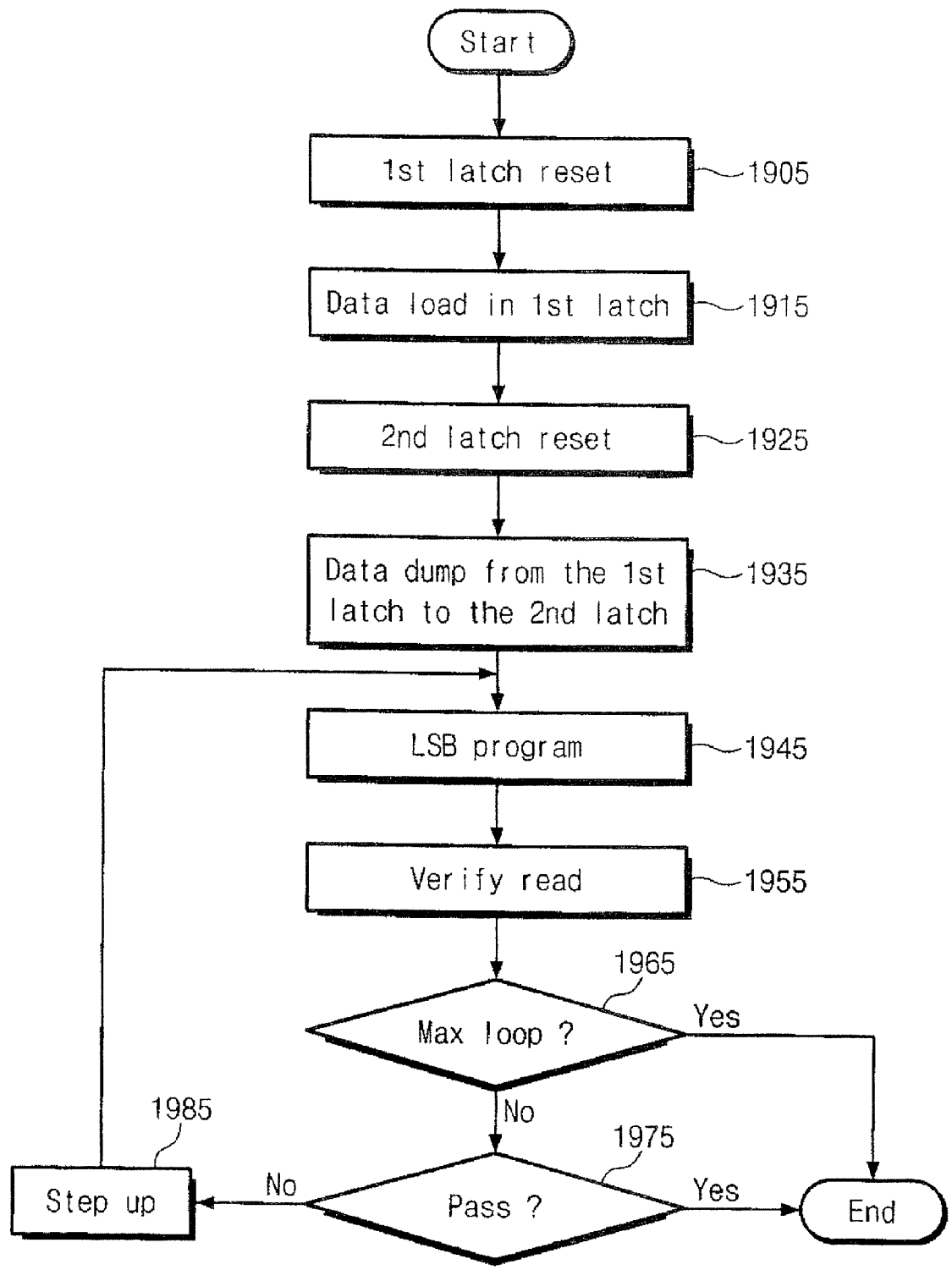
FIG. 19 is a flowchart illustrating operations of LSB programming of FIG. 18 according to some embodiments of the present invention.

Referring now to FIG. 19, a flowchart illustrating operations of the LSB program in embodiments having a double latch page buffer will be discussed. Operations begin at block 1905 by resetting the first latch of the double latch page buffer and then loading the data in the first latch of the double latch page buffer (block 1915). Similarly, the second latch of the double latch page buffer is reset (block 1925) and the second latch of the double latch page buffer is loaded (block 1935). The LSB program is executed (block 1945). As illustrated in FIG. 7, the cell threshold voltage distribution begins at "11" 701 (the erase state). A verify read is performed using a read word line voltage (Vvrfl) as shown in FIG. 7 (block 1955). It is determined if the maximum number of iterations have been reached for the LSB program (block 1965). If it is determined that the maximum number of iterations has been reached (block 1965), operations of the LSB program terminate. If, on the other hand, it is determined that the maximum number of iterations has not been reached (block 1965), it is determined if the cell threshold voltage distribution is "10" (602 of FIG. 7) (block 1975). If it is determined that the cell threshold voltage distribution is "10" (block 1975), the LSB program has passed and operations of the LSB program are terminated. If, on the other hand, it is determined that the cell threshold distribution is not "10" (block 1975), the word line voltage is stepped up (block 1985) and operations of blocks 1945 through 1985 are repeated until either maximum number of iterations is reached (block 1965) or the cell threshold voltage distribution "10" is reached (block 1975). In some embodiments of the present invention, the step up program (block 1985) may be an incremental step pulse program (ISPP), however, embodiments of the present invention are not limited to this configuration.

Figure 20:
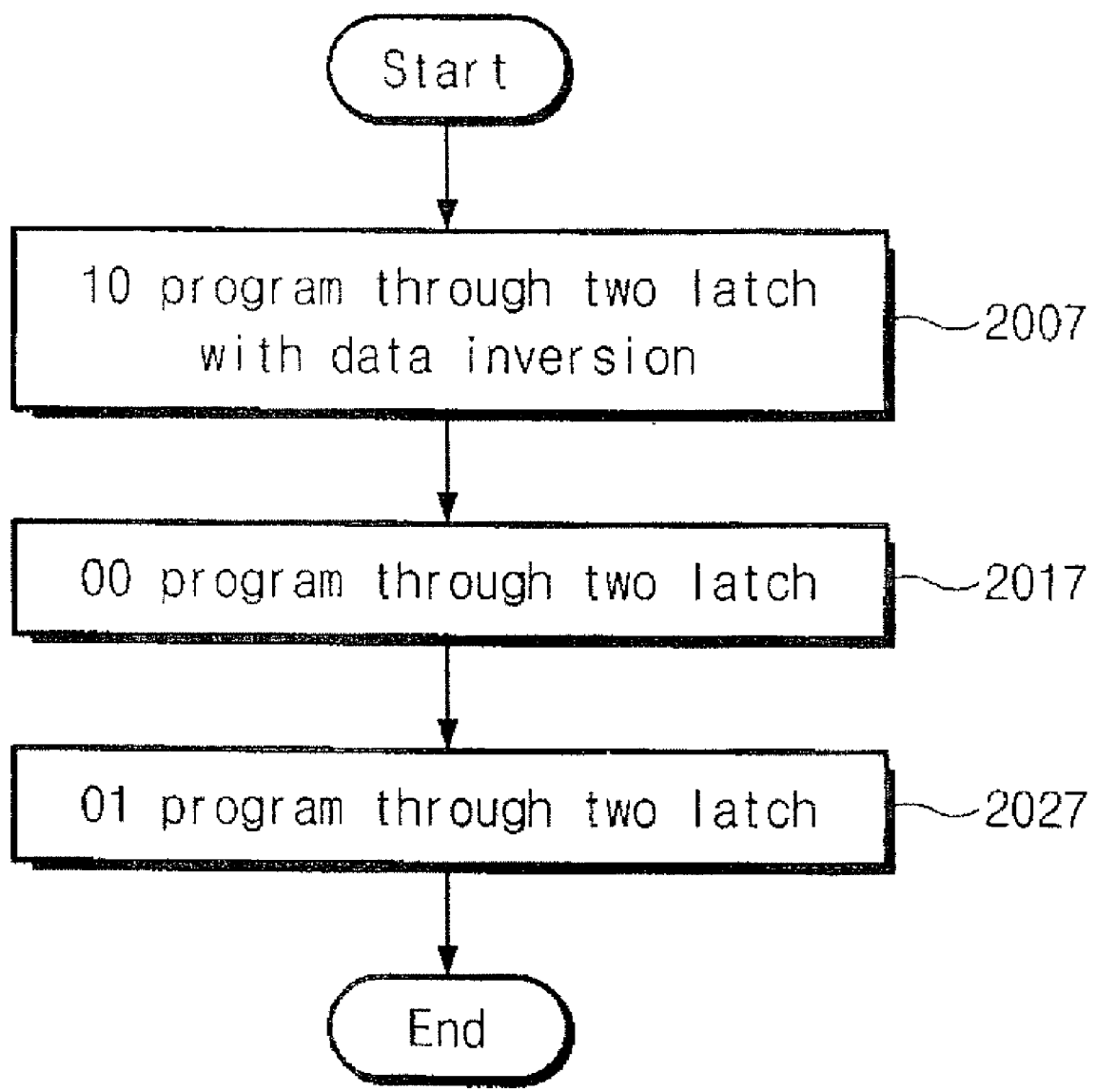
FIG. 20 is a flowchart illustrating operations of MSB programming of FIG. 18 according to some embodiments of the present invention.

Operations of the MSB program according to embodiments of the present invention having a double latch page buffer will now be discussed with respect to the flowchart of FIG. 20. Operations begin at block 2007 by executing the MSB "10" program with data inversion through the double latch page buffer. Once the MSB "10" program with data inversion is complete, the MSB "00" program (block 2017) through the double latch is performed. Finally, once the MSB "00" program is complete, the MSB "01" program (block 2027) through the double latch is performed, which provides the second bit of multi-bit data.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

That which is claimed is:

1. A method of programming a multi-bit non-volatile memory device, the multi-bit non-volatile memory device including a memory cell array including a plurality of memory cells and a storage unit electrically coupled to the memory cell array, the method comprising:
    loading a first bit (FB) of multi-bit data from the storage unit;
    programming the FB into one of the plurality of memory cells in the memory cell array;
    loading an inverted second bit (SB) of multi-bit data from the storage unit; and
    programming the inverted SB into one of the plurality of memory cells in the memory cell array.

2. The method of claim 1, wherein programming a second bit of multi-bit data comprises:
    executing a first SB program using the inverted SB data;
    executing a second SB program; and
    executing a third SB program to provide the programmed second bit of multi-bit data.

3. The method of claim 2, wherein the first SB program operation using the inverted SB data comprises bringing data in one of the memory cells whose data is in FB state "10" before the first SB program operation into SB state "10" after the first SB program operation.

4. The method of claim 3, wherein the SB of multi-bit data in the storage unit is inverted and wherein executing the first SB program comprises executing the first SB program using the inverted data.

5. The method of claim 4, wherein after data inversion data "0" is inhibited and wherein data "1" is programmed.

6. The method of claim 2, wherein the second SB program operation comprises bringing one of the memory cells whose data is in FB state "10" (LSB programmed) before the second SB program into state "00" after the second SB program.

7. The method of claim 2, wherein the third SB program operation comprises bringing one of the memory cells whose data is in state "11" before the third SB program operation into state "01" after the third SB program operation to provide a programmed second bit of multi-bit data.

8. The method of claim 1, wherein programming using the inverted SB data allows the second bit of multi-bit data to be programmed into the memory cell with two read operations.

9. The method of claim 8, wherein reading the second bit of multi-bit data using two read operations further comprises:
    applying a first read voltage to one of the memory cells; and
    applying a second read voltage to the one of the memory cells to read the second bit of multi-bit data in the one of the memory cells.

10. The method of claim 1, further comprising reading the first bit of multi-bit data by applying a read voltage to one of the memory cells to read the first bit of multi-bit data.

11. The method of claim 1, wherein the first bit of multi-bit data corresponds to a least significant bit (LSB) of the multi-bit data and wherein the second bit of multi-bit data corresponds to a most significant bit (MSB) of the multi-bit data.

12. The method of claim 11, wherein the multi-bit data comprises data having one of state "0", state "1", state "2" and state "3" wherein each of the states has a different threshold voltage and wherein an MSB of state "0" is 1 and an LSB of state "0" is 1, an MSB of state "1" is 0 and an LSB of state "1" is 1, an MSB of state "2" is 0 and an LSB of state "2" is 0 and an MSB of state "3" is 1 and an LSB of state "3" is 0.

13. The method of claim 1, wherein programming the second bit of multi-bit data comprises:
   loading the inverted SB data from the storage unit;
   programming the second bit of multi-bit data into one of the plurality of memory cells based on the loaded inverted SB data such that the second bit of multi-bit data is programmed with a maximum of two read operations.

14. The method of claim 1, wherein programming a first bit of multi-bit data from the storage unit comprises:
   loading the multi-bit data;
   programming the first bit of the multi-bit data into one of the plurality of memory cells;
   determining if a the first bit of the multi-bit data has been correctly programmed; and
   incrementally changing a level of the programmed first bit of multi-bit data if the first bit of multi-bit data has not been correctly programmed until it is determined that the first bit of multi-bit data has been correctly programmed or a maximum number of verification cycles has been exceeded.

15. The method of claim 14, wherein loading the multi-bit data is preceded by resetting the storage unit.

16. The method of claim 1, wherein the storage unit comprises a combination of a single latch page buffer and a buffer random access memory (RAM), the first bit of multi-bit data being stored in the single latch page buffer and the second bit of multi-bit data being stored in the buffer RAM.

17. The method of claim 16, wherein preprogrammed data is also stored in the single latch page buffer.

18. The method of claim 1, wherein the storage unit comprises first and second page buffers, wherein the first bit of multi-bit data is stored in the first page buffer and the second bit of multi-bit data is stored in the second page buffer.

19. The method of claim 18, wherein the first page buffer is an upper page buffer and the second page buffer is a lower page buffer.

20. The method of claim 1, wherein the storage unit comprises a double latch page buffer including first and second latches, the first bit of multi-bit data being stored in the first latch of the double latch page buffer and the second bit of multi-bit data being stored in the second latch of the double latch page buffer.

21. A method of programming a multi-bit non-volatile memory device, the multi-bit non-volatile memory device including a memory cell array including a plurality of memory cells and a storage unit electrically coupled to the memory cell array, the method comprising:
   loading a first bit of multi-bit data from the storage unit;
   programming the first bit into one of the plurality of memory cells in the memory cell array;
   inverting a second bit of multi-bit data;
   programming the second bit into one of the plurality of memory cells in the memory cell array;
   loading the inverted second bit from the storage unit; and
   programming the inverted second bit into one of the plurality of memory cells in the memory cell array, such that the second bit is programmed with a maximum of two read operations.

22. A multi-bit non-volatile memory device comprising:
   a memory cell array including a plurality of memory cells; and
   a storage unit electrically coupled to the memory cell array, wherein the memory device is configured to program a first bit of multi-bit data from the storage unit into one of the plurality of memory cells in the memory cell array and program an inverted second bit of multi-bit data from the storage unit into one of the plurality of memory cells in the memory cell array, such that the second bit is programmed with a maximum of two read operations.

23. The memory device of claim 22, wherein the storage unit comprises a combination of a single latch page buffer and a buffer random access memory (RAM), the first bit of multi-bit data being stored in the single latch page buffer and the second bit of multi-bit data being stored in the buffer RAM.

24. The memory device of claim 23, wherein preprogrammed data is stored in the single latch page buffer.

25. The memory device of claim 22, wherein the storage unit comprises first and second page buffers, wherein the first bit of multi-bit data is stored in the first page buffer and the second bit of multi-bit data is stored in the second page buffer.

26. The memory device of claim 25, wherein the first page buffer is an upper page buffer and the second page buffer is a lower page buffer.

27. The memory device of claim 22, wherein the storage unit comprises a double latch page buffer including first and second latches, the first bit of multi-bit data being stored in the first latch of the double latch page buffer and the second bit of multi-bit data being stored in the second latch of the double latch page buffer.

28. The memory device of claim 22, wherein using the inverted second bit data allows the second bit of multi-bit data to be programmed into the memory cell with two read operations.

29. The memory device of claim 22, wherein the memory device is further configured to:
   execute a first SB program using the inverted second bit data;
   execute a second SB program; and
   execute a third SB program to provide the second bit of multi-bit data.

* * * * *